US012771479B2

(12) United States Patent
Yang et al.

(10) Patent No.: US 12,771,479 B2
(45) Date of Patent: Oct. 20, 2026

(54) RATE MATCHING AND BIT FREEZING FOR SYSTEMATIC POLAR CODES

(71) Applicant: QUALCOMM Incorporated, San Diego, CA (US)

(72) Inventors: Wei Yang, San Diego, CA (US); Thomas Joseph Richardson, South Orange, NJ (US); Kirill Ivanov, La Jolla, CA (US); Gabi Sarkis, San Diego, CA (US); Jing Jiang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 105 days.

(21) Appl. No.: 18/814,300

(22) Filed: Aug. 23, 2024

(65) Prior Publication Data

US 2026/0058757 A1 Feb. 26, 2026

(51) Int. Cl.
*H04L 1/00* (2006.01)
*H03M 13/00* (2006.01)

(52) U.S. Cl.
CPC ........ *H04L 1/0067* (2013.01); *H03M 13/635* (2013.01); *H04L 1/0013* (2013.01)

(58) Field of Classification Search
CPC ... H04L 1/0067; H04L 1/0013; H03M 13/635
See application file for complete search history.

(56) References Cited

U.S. PATENT DOCUMENTS

| | | | |
|---|---|---|---|
| 7,356,752 | B2 | 4/2008 | Hewitt et al. |
| 8,020,062 | B2 | 9/2011 | Jeong et al. |
| 10,193,578 | B2 | 1/2019 | Gross et al. |
| 11,924,016 | B2 | 3/2024 | Gresset |

(Continued)

FOREIGN PATENT DOCUMENTS

| | | |
|---|---|---|
| EP | 4354775 A1 | 4/2024 |

OTHER PUBLICATIONS

Vangala et al. (H. Vangala, Y. Hong and E. Viterbo, "Efficient Algorithms for Systematic Polar Encoding," in IEEE Communications Letters, vol. 20, No. 1, pp. 17-20, Jan. 2016, doi: 10.1109/LCOMM.2015.2497220) (Year: 2016).*

(Continued)

*Primary Examiner* — Joseph D Torres
(74) *Attorney, Agent, or Firm* — Harrity & Harrity, LLP

(57) ABSTRACT

Various aspects of the present disclosure generally relate to wireless communication. For example, when an output from a systematic polar encoder has a coded bit length N that differs from a target code length E, locations for bit freezing may be selected such that a resulting set of information bit locations (including cyclic redundancy code (CRC) bit locations) satisfy a systematic encoding condition. Furthermore, when the coded bit length N exceeds the target code length E, such that shortening or puncturing is performed to achieve the target code length, locations for shortening or puncturing may be selected to ensure that the set of information bit locations satisfy the systematic encoding condition. In this way, the systematic polar code may include a set of systematic bits at the same locations as the information bits, and the systematic bits do not appear in any untransmitted (for example, punctured or shortened) locations.

32 Claims, 10 Drawing Sheets

(56) References Cited

U.S. PATENT DOCUMENTS

| | | | | |
|---|---|---|---|---|
| 2017/0005753 | A1* | 1/2017 | Shen | H04L 1/1867 |
| 2017/0012740 | A1* | 1/2017 | Shen | H04L 1/0067 |
| 2018/0367239 | A1 | 12/2018 | Jang et al. | |
| 2019/0215105 | A1 | 7/2019 | Xu et al. | |
| 2019/0319745 | A1* | 10/2019 | Pan | H04J 11/0076 |
| 2019/0320434 | A1 | 10/2019 | You et al. | |
| 2019/0349141 | A1 | 11/2019 | Ahn et al. | |
| 2025/0343627 | A1* | 11/2025 | Yang | H03M 13/13 |

OTHER PUBLICATIONS

Mediatek Inc: "Discussion on Polar Code Design and Performance", 3GPP TSG RAN WG1 Meeting #85bis, 3GPP Draft; R1-165454 Discussion on Polar Code Design and Performance, 3rd Generation Partnership Project (3GPP), Mobile Competence Centre, 650, Route Des Lucioles ; F-06921 Sophia-Antipolis Cedex, France, vol. RAN WG1, No. Nanjing, China; May 23, 2016-May 27, 2016, May 24, 2016 (May 24, 2016), 7 Pages, XP051104208, the whole document.

Arikan E., et al., "Systematic Polar Coding", IEEE Communications Letters, IEEE Service Center, Piscataway, NJ, US, vol. 15, No. 8, Aug. 1, 2011, pp. 860-862, XP011380828, DOI: 10.1109/LCOMM.2011.061611.110862.

International Search Report and Written Opinion PCT/US2025/039298 ISA/EPO Nov. 20, 2025.

Jang M., et al., "Puncturing and Shortening for Polar Codes via the Partial Order by Binary Domination", 2019 IEEE International Symposium on Information Theory (ISIT), IEEE, Jul. 7, 2019, pp. 1767-1771, XP033620121, DOI: 10.1109/ISIT.2019.8849450.

Sarkis G., et al., "Flexible and Low-Complexity Encoding and Decoding of Systematic Polar Codes", IEEE Transactions on Communications, IEEE Service Center, Piscataway, NJ. USA, vol. 64, No. 7, Jul. 1, 2016, pp. 2732-2745, XP011616638, DOI: 10.1109/TCOMM.2016.2574996, section II.A & II.B; figure 1.

Zhu H., et al., "Rate-compatible Systematic Polar Codes", IET Communications, the Institution of Engineering and Technology, GB, vol. 15, No. 15, May 14, 2021, pp. 1930-1940, XP006112181, DOI: 10.1049/CMU2.12204, Abstract, sections 2.1-2.4, 3.1, 3.2, figures 1, 2.

* cited by examiner

RATE MATCHING AND BIT FREEZING FOR SYSTEMATIC POLAR CODES

FIELD OF THE DISCLOSURE

Aspects of the present disclosure generally relate to wireless communication and specifically relate to techniques, apparatuses, and methods associated with rate matching and bit freezing for systematic polar codes.

BACKGROUND

Wireless communication systems are widely deployed to provide various services that may include carrying voice, text, messaging, video, data, and/or other traffic. The services may include unicast, multicast, and/or broadcast services, among other examples. Typical wireless communication systems may employ multiple-access radio access technologies (RATs) capable of supporting communication with multiple users by sharing available system resources (for example, time domain resources, frequency domain resources, spatial domain resources, and/or device transmit power, among other examples). Examples of such multiple-access RATs include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

The above multiple-access RATs have been adopted in various telecommunication standards to provide common protocols that enable different wireless communication devices to communicate on a municipal, national, regional, or global level. An example telecommunication standard is New Radio (NR). NR, which may also be referred to as 5G, is part of a continuous mobile broadband evolution promulgated by the Third Generation Partnership Project (3GPP). NR (and other mobile broadband evolutions beyond NR) may be designed to better support Internet of things (IoT) and reduced capability device deployments, industrial connectivity, millimeter wave (mmWave) expansion, licensed and unlicensed spectrum access, non-terrestrial network (NTN) deployment, sidelink and other device-to-device direct communication technologies (for example, cellular vehicle-to-everything (CV2X) communication), massive multiple-input multiple-output (MIMO), disaggregated network architectures and network topology expansions, multiple-subscriber implementations, high-precision positioning, and/or radio frequency (RF) sensing, among other examples. As the demand for mobile broadband access continues to increase, further improvements in NR may be implemented, and other radio access technologies such as 6G may be introduced, to further advance mobile broadband evolution.

In a wireless communication system, information is generally represented as a sequence of binary bits that are mapped (for example, modulated) to an analog signal waveform that is then transmitted to a receiver over a wireless communication channel. In some cases, however, the wireless communication channel may introduce errors that may corrupt the transmitted signal due to random noise, interference, device impairments, and/or other factors. At the receiver, the received signal (that may have been corrupted during transmission) is mapped back to binary bits, with the received binary information estimating the transmitted binary information. Accordingly, because errors may corrupt the signal that is estimated at the receiver, channel coding or forward error correction (FEC) techniques are often used to control errors in data transmission over unreliable or noisy communication channels or otherwise mitigate the bit errors that may occur due to noise, interference, and/or other factors. For example, channel coding generally includes an encoding operation performed at a transmitter (for example, a first wireless device, which may be a user equipment (UE) or a network node) and a decoding operation performed at a receiver (for example, a second wireless device, which may be a UE or a network node). Channel coding is generally accomplished by selectively introducing redundancy into the transmitted information stream, typically using an error correction code (ECC), which allows the receiver to detect errors and/or correct bit errors in the received data stream and thereby provide more reliable information transmission. Accordingly, channel codes are often used in scenarios where retransmissions are undesirable and/or high transmission reliability is needed, such as downlink and/or uplink control channel communications.

For example, in some cases, a wireless network may use polar codes to implement channel coding for downlink and/or uplink control channel communications. More particularly, polar coding is a linear block coding technique that has provable capacity-achieving performance over binary channels with polynomial complexity in various scenarios (such as channel coding, among others). Polar coding has a built-in channel polarization structure that uses a recursive construction to split (or "polarize") a communication channel into reliable subchannels that are very good for transmitting information and unreliable subchannels that are very bad for transmitting information. The reliable subchannels may be almost completely noiseless, with a capacity that approaches 1, and the unreliable subchannels may be almost completely noisy, with a capacity that approaches 0. During polar encoding, a polar transform is applied to assign information bits to the reliable subchannels and to assign "frozen" or "fixed" bits (for example, "0" bits) to the unreliable subchannels. For example, a polar code with a rate R=K/N may be defined according to a set of parameters $\{N, K, G_N, A\}$, where N is a code block length with $N=2^n$, for $n\geq1$, K is a code dimension, A is a data index set, $A\subset\{1, 2, \ldots, N\}$ with size $|A|=K$, and $G_N$ is a polar transform defined by:

$$G_2=\begin{bmatrix}1 & 0\\ 1 & 1\end{bmatrix},\ G_N=\begin{bmatrix}G_{N/2} & 0\\ G_{N/2} & G_{N/2}\end{bmatrix}=G_2^{\otimes n}$$

Given a data block $d=(d_1, \ldots, d_K)$, a polar code with the parameters $\{N, K, G_N, A\}$ encodes the data block d in two steps, where the first step is to construct a transform input block $u=(u_1, \ldots, u_N)$ by setting:

$$u_A \triangleq (u_i : i\in A)=d,\ u_{A^C} \triangleq (u_i : i\in A^C)=0$$

and the second step is to compute the code block x by computing the polar transform of u, where $x=uG_N$. Accordingly, polar codes have an encoding/decoding complexity given by N log N, a construction complexity that is roughly O(N), and a block error probability that approaches zero roughly as $2^{-\sqrt{N}}$ for any fixed rate R that is less than a channel capacity (for example, there is no error floor).

In a standard form, polar codes are non-systematic, in that a codeword transmitted over a channel differs from the original data input to the polar encoder (for example, the information bits do not appear in the codeword transparently). For example, when using a polar code to transmit raw data with the value "0101", the raw data may have a different form, such as "1100", in the codeword transmitted over the channel. In contrast, in a systematic code, the codeword (after encoding) contains the raw information bits (for example, in a systematic code, raw data with the value "0101" appears as "0101" plus one or more parity bits). In some wireless networks, the (standard) non-systematic form of polar codes are adopted, due to questions regarding whether polar codes could be encoded systematically while retaining the low-complexity properties of non-systematic polar encoding and/or whether any significant performance benefit arise from systematic versus non-systematic polar encoding. However, there are various circumstances where systematic encoding provides meaningful performance benefits while preserving low-complexity.

For example, although systematic polar codes and non-systematic polar codes have the same block error rate (BLER) for binary uniform sources (where "0" bits and "1" bits appear with a roughly equal probability in a sequence of information bits to be encoded), systematic polar codes tend to have a better bit error rate (BER). Furthermore, systematic polar codes may be significantly more effective in exploiting side information about a source relative to non-systematic polar codes. For example, in contrast to low-density parity-check (LDPC) codes and other use cases where a receiver has no prior knowledge regarding whether a given bit is a "0" or a "1", there are various scenarios, where the receiver may have access to side information about information bit values. For example, in control channel communications (that generally use polar codes), certain fields may have values that are unchanged over multiple consecutive transmissions. In such cases, when one or more information bits have the same value over multiple consecutive transmissions, a receiver can predict a likelihood that the one or more information bits have the same value(s) as a previously decoded transmission. Accordingly, in cases where values for certain transmitted bits can be predicted with a high probability (for example, in artificial intelligence (AI) and/or machine learning (AI/ML) applications or other data-driven systems or coding designs), systematic polar codes may provide significant advantages over non-systematic polar codes.

However, systematic polar codes pose various challenges in practical wireless systems. For example, as described above, a mother polar code generally has a coded bit length $N=2^n$, where n is a positive integer, which may differ from a target codeword length E that is needed to achieve a desired rate R=K/E, where K is a quantity of information bits. Accordingly, rate matching for polar codes becomes a length matching problem, where puncturing, shortening, or repetition is performed such that the quantity of transmitted bits equals the target codeword length E. For example, puncturing and shortening both reduce the length of the mother polar code by not transmitting bits in a certain pattern (for example, when E<N), referred to as a puncturing pattern or a shortening pattern, while repetition increases the length of the mother polar code by retransmitting bits. Accordingly, because the information bits and frozen bits need to be in certain locations in a systematic polar encoding, rate matching may interfere with generating systematic polar codes due to changing the set of information bit locations (for example, some information bits may not be in the codeword when the location of some information bits change in an input domain or an intermediate domain of a systematic polar encoder).

SUMMARY

Some aspects described herein relate to a method for wireless communication by a transmitter. The method may include obtaining an input sequence including a set of information bits and a set of frozen bits, the set of information bits associated with a set of information bit locations that satisfies a systematic encoding condition in accordance with a rate matching mode. The method may include encoding the input sequence using a systematic polar encoder to obtain a systematic polar code that includes a first sequence of coded bits. The method may include performing a rate matching operation on the first sequence of coded bits in accordance with the rate matching mode to produce a second sequence of coded bits associated with the systematic polar code. The method may include transmitting the second sequence of coded bits associated with the systematic polar code in accordance with the rate matching mode.

Some aspects described herein relate to a transmitter for wireless communication. The transmitter may include a processing system that includes one or more processors and one or more memories coupled with the one or more processors. The processing system may be configured to cause the transmitter to obtain an input sequence including a set of information bits and a set of frozen bits, the set of information bits associated with a set of information bit locations that satisfies a systematic encoding condition in accordance with a rate matching mode. The processing system may be configured to cause the transmitter to encode the input sequence using a systematic polar encoder to obtain a systematic polar code that includes a first sequence of coded bits. The processing system may be configured to cause the transmitter to perform a rate matching operation on the first sequence of coded bits in accordance with the rate matching mode to produce a second sequence of coded bits associated with the systematic polar code. The processing system may be configured to cause the transmitter to transmit the second sequence of coded bits associated with the systematic polar code in accordance with the rate matching mode.

Some aspects described herein relate to a non-transitory computer-readable medium that stores a set of instructions for wireless communication by a transmitter. The set of instructions, when executed by one or more processors of the transmitter, may cause the transmitter to obtain an input sequence including a set of information bits and a set of frozen bits, the set of information bits associated with a set of information bit locations that satisfies a systematic encoding condition in accordance with a rate matching mode. The set of instructions, when executed by one or more processors of the transmitter, may cause the transmitter to encode the input sequence using a systematic polar encoder to obtain a systematic polar code that includes a first sequence of coded bits. The set of instructions, when executed by one or more processors of the transmitter, may cause the transmitter to perform a rate matching operation on the first sequence of coded bits in accordance with the rate matching mode to produce a second sequence of coded bits associated with the systematic polar code. The set of instructions, when executed by one or more processors of the transmitter, may cause the transmitter to transmit the second sequence of coded bits associated with the systematic polar code in accordance with the rate matching mode.

Some aspects described herein relate to an apparatus for wireless communication. The apparatus may include means for obtaining an input sequence including a set of information bits and a set of frozen bits, the set of information bits associated with a set of information bit locations that satisfies a systematic encoding condition in accordance with a rate matching mode. The apparatus may include means for encoding the input sequence using a systematic polar encoder to obtain a systematic polar code that includes a first sequence of coded bits. The apparatus may include means for performing a rate matching operation on the first sequence of coded bits in accordance with the rate matching mode to produce a second sequence of coded bits associated with the systematic polar code. The apparatus may include means for transmitting the second sequence of coded bits associated with the systematic polar code in accordance with the rate matching mode.

Aspects of the present disclosure may generally be implemented by or as a method, apparatus, system, computer program product, non-transitory computer-readable medium, user equipment, base station, network node, network entity, wireless communication device, and/or processing system as substantially described with reference to, and as illustrated by, the specification and accompanying drawings.

The foregoing paragraphs of this section have broadly summarized some aspects of the present disclosure. These and additional aspects and associated advantages will be described hereinafter. The disclosed aspects may be used as a basis for modifying or designing other aspects for carrying out the same or similar purposes of the present disclosure. Such equivalent aspects do not depart from the scope of the appended claims. Characteristics of the aspects disclosed herein, both their organization and method of operation, together with associated advantages, will be better understood from the following description when considered in connection with the accompanying drawings.

BRIEF DESCRIPTION OF THE DRAWINGS

The appended drawings illustrate some aspects of the present disclosure, but are not limiting of the scope of the present disclosure because the description may enable other aspects. Each of the drawings is provided for purposes of illustration and description, and not as a definition of the limits of the claims. The same or similar reference numbers in different drawings may identify the same or similar elements.

DETAILED DESCRIPTION

Figure 1:
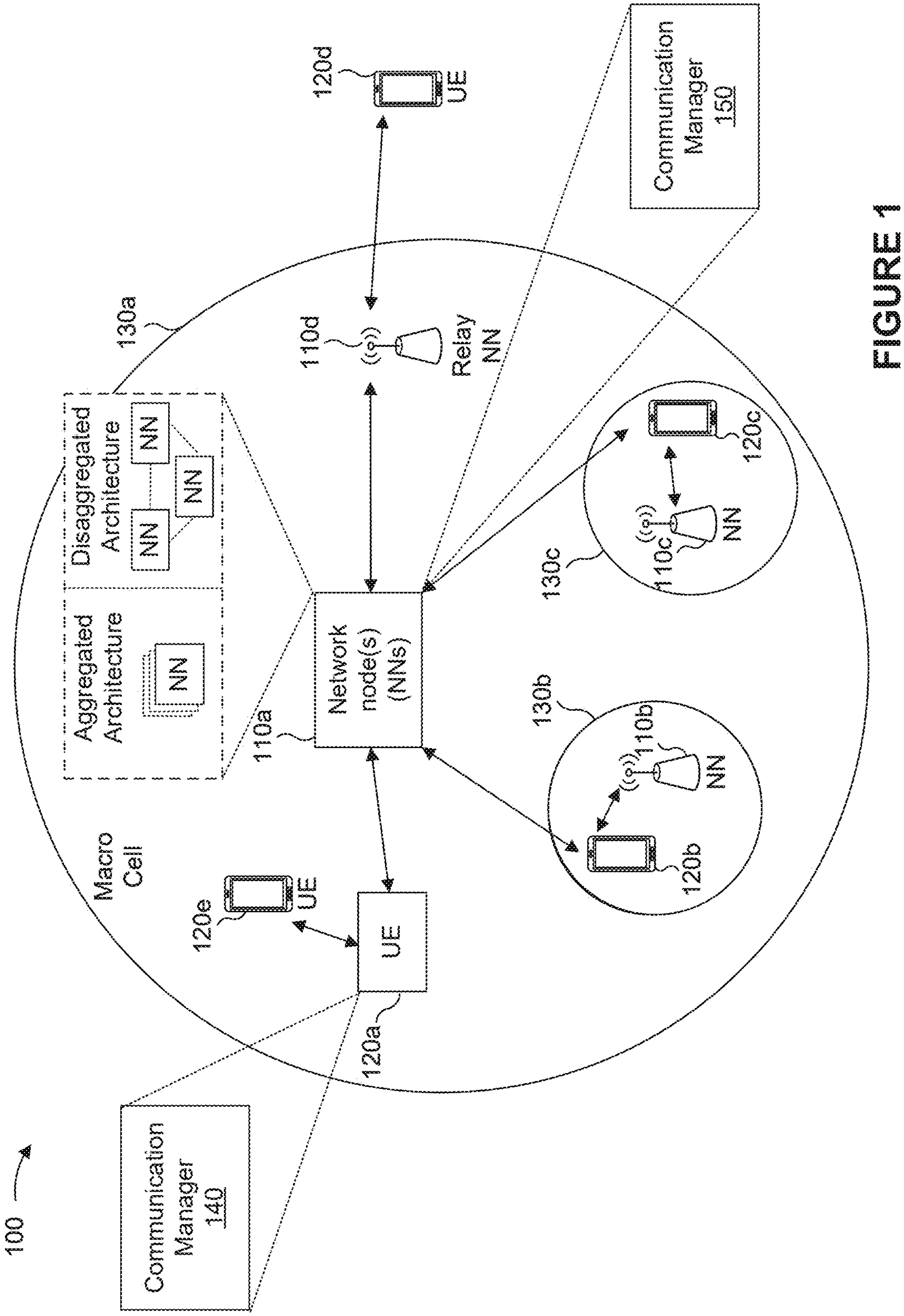
FIG. 1 is a diagram illustrating an example of a wireless network in accordance with the present disclosure.

Various aspects of the present disclosure are described hereinafter with reference to the accompanying drawings. However, aspects of the present disclosure may be embodied in many different forms and is not to be construed as limited to any specific aspect illustrated by or described with reference to an accompanying drawing or otherwise presented in this disclosure. Rather, these aspects are provided so that this disclosure will be thorough and complete, and will fully convey the scope of the disclosure to those skilled in the art. One skilled in the art may appreciate that the scope of the disclosure is intended to cover any aspect of the disclosure disclosed herein, whether implemented independently of or in combination with any other aspect of the disclosure. For example, an apparatus may be implemented or a method may be practiced using various combinations or quantities of the aspects set forth herein. In addition, the scope of the disclosure is intended to cover an apparatus having, or a method that is practiced using, other structures and/or functionalities in addition to or other than the structures and/or functionalities with which various aspects of the disclosure set forth herein may be practiced. Any aspect of the disclosure disclosed herein may be embodied by one or more elements of a claim.

Several aspects of telecommunication systems will now be presented with reference to various methods, operations, apparatuses, and techniques. These methods, operations, apparatuses, and techniques will be described in the following detailed description and illustrated in the accompanying drawings by various blocks, modules, components, circuits, steps, processes, or algorithms (collectively referred to as "elements"). These elements may be implemented using hardware, software, or a combination of hardware and software. Whether such elements are implemented as hardware or software depends upon the particular application and design constraints imposed on the overall system.

Various aspects relate generally to systematic polar encoding. Some aspects more specifically relate to rate matching and bit freezing for systematic polar codes. For example, to encode a systematic polar code, an input sequence that includes a set of information bits and a set of frozen bits may be non-systematically encoded into an intermediate sequence, bits at frozen bit locations may be reset to the values of the frozen bits, and the intermediate sequence may be non-systematically encoded again (for example, a systematic polar code can be implemented by calling a non-systematic encoder twice). Furthermore, when the systematic polar code has a coded bit length N that exceeds a target code length E, such that shortening or puncturing is needed to achieve the target code length, locations for shortening or puncturing and for bit freezing may be selected such that a resulting set of information bit locations (including cyclic redundancy code (CRC) bit locations) in a set A corresponding to a set of indexes associated with the information bits for the systematic polar code satisfy a systematic encoding condition. In some aspects, as described herein, the locations for shortening or puncturing and for bit freezing may be selected according to explicit (sufficient) conditions that guarantee that the indexes of the shortening/puncturing locations and bit freezing locations satisfy the systematic encoding condition. Alternatively, when the systematic polar code has a coded bit length N that is shorter than the target code length E, such that repetition is needed to achieve the target code length, the transmitter may prioritize repetition of systematic bits in the codeword over non-systematic bits. For example, when the quantity of bits to be repeated, L, is less than or equal to the quantity of systematic bits, K, the transmitter may repeat the first L systematic bits. Alternatively, when L exceeds K, the transmitter may repeat all K systematic bits plus L—K non-systematic bits.

Particular aspects of the subject matter described in this disclosure can be implemented to realize one or more of the following potential advantages. In some examples, the described techniques can be used to enable a low-complexity systematic polar encoding when a systematic polar code has a coded bit length that differs from a target coded bit length, which may enable a better bit error rate (BER) than a non-systematic polar code and/or better performance than non-systematic polar codes in use cases where a receiver may have side information or prior knowledge regarding a source of the codeword. In addition, by selecting the locations for shortening or puncturing and for bit freezing according to explicit (sufficient) conditions that guarantee that the indexes of the shortening/puncturing locations and bit freezing locations satisfy a systematic encoding condition, the transmitter that encodes the systematic polar code does not have to verify that the systematic encoding condition is satisfied, which conserves resources and reduces complexity at the transmitter. Additionally, in cases where repetition is performed, prioritizing the repetition of systematic bits over non-systematic bits may provide more protections to the systematic bits of the polar code, which may improve decoding performance.

Multiple-access radio access technologies (RATs) have been adopted in various telecommunication standards to provide common protocols that enable wireless communication devices to communicate on a municipal, enterprise, national, regional, or global level. For example, 5G New Radio (NR) is part of a continuous mobile broadband evolution promulgated by the Third Generation Partnership Project (3GPP). 5G NR supports various technologies and use cases including enhanced mobile broadband (eMBB), ultra-reliable low-latency communication (URLLC), massive machine-type communication (mMTC), millimeter wave (mmWave) technology, beamforming, network slicing, edge computing, Internet of Things (IoT) connectivity and management, and network function virtualization (NFV).

As the demand for broadband access increases and as technologies supported by wireless communication networks evolve, further technological improvements may be adopted in or implemented for 5G NR or future RATs, such as 6G, to further advance the evolution of wireless communication for a wide variety of existing and new use cases and applications. Such technological improvements may be associated with new frequency band expansion, licensed and unlicensed spectrum access, overlapping spectrum use, small cell deployments, non-terrestrial network (NTN) deployments, disaggregated network architectures and network topology expansion, device aggregation, advanced duplex communication, sidelink and other device-to-device direct communication, IoT (including passive or ambient IoT) networks, reduced capability (RedCap) user equipment (UE) functionality, industrial connectivity, multiple-subscriber implementations, high-precision positioning, radio frequency (RF) sensing, and/or artificial intelligence or machine learning (AI/ML), among other examples. These technological improvements may support use cases such as wireless backhauls, wireless data centers, extended reality (XR) and metaverse applications, meta services for supporting vehicle connectivity, holographic and mixed reality communication, autonomous and collaborative robots, vehicle platooning and cooperative maneuvering, sensing networks, gesture monitoring, human-brain interfacing, digital twin applications, asset management, and universal coverage applications using non-terrestrial and/or aerial platforms, among other examples. The methods, operations, apparatuses, and techniques described herein may enable one or more of the foregoing technologies and/or support one or more of the foregoing use cases.

FIG. 1 is a diagram illustrating an example of a wireless communication network 100, in accordance with the present disclosure. The wireless communication network 100 may be or may include elements of a 5G (or NR) network or a 6G network, among other examples. The wireless communication network 100 may include multiple network nodes 110, shown as a network node (NN) 110*a*, a network node 110*b*, a network node 110*c*, and a network node 110*d*. The network nodes 110 may support communications with multiple UEs 120, shown as a UE 120*a*, a UE 120*b*, a UE 120*c*, a UE 120*d*, and a UE 120*c*.

The network nodes 110 and the UEs 120 of the wireless communication network 100 may communicate using the electromagnetic spectrum, which may be subdivided by frequency or wavelength into various classes, bands, carriers, and/or channels. For example, devices of the wireless communication network 100 may communicate using one or more operating bands. In some aspects, multiple wireless communication networks 100 may be deployed in a given geographic area. Each wireless communication network 100 may support a particular RAT (which may also be referred to as an air interface) and may operate on one or more carrier frequencies in one or more frequency ranges. Examples of RATs include a 4G RAT, a 5G/NR RAT, and/or a 6G RAT, among other examples. In some examples, when multiple RATs are deployed in a given geographic area, each RAT in the geographic area may operate on different frequencies to avoid interference with one another.

Various operating bands have been defined as frequency range designations FR1 (410 MHz through 7.125 GHZ), FR2 (24.25 GHz through 52.6 GHZ), FR3 (7.125 GHz through 24.25 GHZ), FR4a or FR4-1 (52.6 GHz through 71 GHZ), FR4 (52.6 GHZ through 114.25 GHZ), and FR5 (114.25 GHz through 300 GHz). Although a portion of FR1 is greater than 6 GHZ, FR1 is often referred to (interchangeably) as a "Sub-6 GHz" band in some documents and articles. Similarly, FR2 is often referred to (interchangeably) as a "millimeter wave" band in some documents and articles, despite being different than the extremely high frequency (EHF) band (30 GHz through 300 GHz), which is identified by the International Telecommunications Union (ITU) as a "millimeter wave" band. The frequencies between FR1 and FR2 are often referred to as mid-band frequencies, which include FR3. Frequency bands falling within FR3 may inherit FR1 characteristics or FR2 characteristics, and thus may effectively extend features of FR1 or FR2 into mid-band frequencies. Thus, "sub-6 GHz," if used herein, may broadly refer to frequencies that are less than 6 GHZ, that are within FR1, and/or that are included in mid-band frequencies. Similarly, the term "millimeter wave," if used herein, may broadly refer to frequencies that are included in mid-band frequencies, that are within FR2, FR4, FR4-a or FR4-1, or FR5, and/or that are within the EHF band. Higher frequency bands may extend 5G NR operation, 6G operation, and/or other RATs beyond 52.6 GHz. For example, each of FR4a, FR4-1, FR4, and FR5 falls within the EHF band. In some examples, the wireless communication network 100 may implement dynamic spectrum sharing (DSS), in which multiple RATs (for example, 4G/Long Term Evolution (LTE) and 5G/NR) are implemented with dynamic bandwidth allocation (for example, based on user demand) in a single frequency band. It is contemplated that the frequencies included in these operating bands (for example, FR1, FR2, FR3, FR4, FR4-a, FR4-1, and/or FR5) may be modified, and techniques described herein may be applicable to those modified frequency ranges.

A network node 110 may include one or more devices, components, or systems that enable communication between a UE 120 and one or more devices, components, or systems of the wireless communication network 100. A network node 110 may be, may include, or may also be referred to as an NR network node, a 5G network node, a 6G network node, a Node B, an eNB, a gNB, an access point (AP), a transmission reception point (TRP), a mobility element, a core, a network entity, a network element, a network equipment, and/or another type of device, component, or system included in a radio access network (RAN).

A network node 110 may be implemented as a single physical node (for example, a single physical structure) or may be implemented as two or more physical nodes (for example, two or more distinct physical structures). For example, a network node 110 may be a device or system that implements part of a radio protocol stack, a device or system that implements a full radio protocol stack (such as a full gNB protocol stack), or a collection of devices or systems that collectively implement the full radio protocol stack. For example, and as shown, a network node 110 may be an aggregated network node (having an aggregated architecture), meaning that the network node 110 may implement a full radio protocol stack that is physically and logically integrated within a single node (for example, a single physical structure) in the wireless communication network 100. For example, an aggregated network node 110 may consist of a single standalone base station or a single TRP that uses a full radio protocol stack to enable or facilitate communication between a UE 120 and a core network of the wireless communication network 100.

Alternatively, and as also shown, a network node 110 may be a disaggregated network node (sometimes referred to as a disaggregated base station), meaning that the network node 110 may implement a radio protocol stack that is physically distributed and/or logically distributed among two or more nodes in the same geographic location or in different geographic locations. For example, a disaggregated network node may have a disaggregated architecture. In some deployments, disaggregated network nodes 110 may be used in an integrated access and backhaul (IAB) network, in an open radio access network (O-RAN) (such as a network configuration in compliance with the O-RAN Alliance), or in a virtualized radio access network (vRAN), also known as a cloud radio access network (C-RAN), to facilitate scaling by separating base station functionality into multiple units that can be individually deployed.

The network nodes 110 of the wireless communication network 100 may include one or more central units (CUs), one or more distributed units (DUs), and/or one or more radio units (RUS). A CU may host one or more higher layer control functions, such as radio resource control (RRC) functions, packet data convergence protocol (PDCP) functions, and/or service data adaptation protocol (SDAP) functions, among other examples. A DU may host one or more of a radio link control (RLC) layer, a medium access control (MAC) layer, and/or one or more higher physical (PHY) layers depending, at least in part, on a functional split, such as a functional split defined by the 3GPP. In some examples, a DU also may host one or more lower PHY layer functions, such as a fast Fourier transform (FFT), an inverse FFT (iFFT), beamforming, physical random access channel (PRACH) extraction and filtering, and/or scheduling of resources for one or more UEs 120, among other examples. An RU may host RF processing functions or lower PHY layer functions, such as an FFT, an iFFT, beamforming, or PRACH extraction and filtering, among other examples, according to a functional split, such as a lower layer functional split. In such an architecture, each RU can be operated to handle over the air (OTA) communication with one or more UEs 120.

In some aspects, a single network node 110 may include a combination of one or more CUs, one or more DUs, and/or one or more RUs. Additionally or alternatively, a network node 110 may include one or more Near-Real Time (Near-RT) RAN Intelligent Controllers (RICs) and/or one or more Non-Real Time (Non-RT) RICs. In some examples, a CU, a DU, and/or an RU may be implemented as a virtual unit, such as a virtual central unit (VCU), a virtual distributed unit (VDU), or a virtual radio unit (VRU), among other examples. A virtual unit may be implemented as a virtual network function, such as associated with a cloud deployment.

Some network nodes 110 (for example, a base station, an RU, or a TRP) may provide communication coverage for a particular geographic area. In the 3GPP, the term "cell" can refer to a coverage area of a network node 110 or to a network node 110 itself, depending on the context in which the term is used. A network node 110 may support one or multiple (for example, three) cells. In some examples, a network node 110 may provide communication coverage for a macro cell, a pico cell, a femto cell, or another type of cell. A macro cell may cover a relatively large geographic area (for example, several kilometers in radius) and may allow unrestricted access by UEs 120 with service subscriptions. A pico cell may cover a relatively small geographic area and may allow unrestricted access by UEs 120 with service subscriptions. A femto cell may cover a relatively small geographic area (for example, a home) and may allow restricted access by UEs 120 having association with the femto cell (for example, UEs 120 in a closed subscriber group (CSG)). A network node 110 for a macro cell may be referred to as a macro network node. A network node 110 for a pico cell may be referred to as a pico network node. A network node 110 for a femto cell may be referred to as a femto network node or an in-home network node. In some examples, a cell may not necessarily be stationary. For example, the geographic area of the cell may move according to the location of an associated mobile network node 110 (for example, a train, a satellite base station, an unmanned aerial vehicle, or an NTN network node).

The wireless communication network 100 may be a heterogeneous network that includes network nodes 110 of different types, such as macro network nodes, pico network nodes, femto network nodes, relay network nodes, aggregated network nodes, and/or disaggregated network nodes, among other examples. In the example shown in FIG. 1, the network node 110*a* may be a macro network node for a macro cell 130*a*, the network node 110*b* may be a pico network node for a pico cell 130*b*, and the network node 110*c* may be a femto network node for a femto cell 130*c*. Various different types of network nodes 110 may generally transmit at different power levels, serve different coverage areas, and/or have different impacts on interference in the wireless communication network 100 than other types of network nodes 110. For example, macro network nodes may have a high transmit power level (for example, 5 to 40 watts), whereas pico network nodes, femto network nodes, and relay network nodes may have lower transmit power levels (for example, 0.1 to 2 watts).

In some examples, a network node 110 may be, may include, or may operate as an RU, a TRP, or a base station that communicates with one or more UEs 120 via a radio access link (which may be referred to as a "Uu" link). The radio access link may include a downlink and an uplink. "Downlink" (or "DL") refers to a communication direction from a network node 110 to a UE 120, and "uplink" (or "UL") refers to a communication direction from a UE 120 to a network node 110. Downlink channels may include one or more control channels and one or more data channels. A downlink control channel may be used to transmit downlink control information (DCI) (for example, scheduling information, reference signals, and/or configuration information) from a network node 110 to a UE 120. A downlink data channel may be used to transmit downlink data (for example, user data associated with a UE 120) from a network node 110 to a UE 120. Downlink control channels may include one or more physical downlink control channels (PDCCHs), and downlink data channels may include one or more physical downlink shared channels (PDSCHs). Uplink channels may similarly include one or more control channels and one or more data channels. An uplink control channel may be used to transmit uplink control information (UCI) (for example, reference signals and/or feedback corresponding to one or more downlink transmissions) from a UE 120 to a network node 110. An uplink data channel may be used to transmit uplink data (for example, user data associated with a UE 120) from a UE 120 to a network node 110. Uplink control channels may include one or more physical uplink control channels (PUCCHs), and uplink data channels may include one or more physical uplink shared channels (PUSCHs). The downlink and the uplink may each include a set of resources on which the network node 110 and the UE 120 may communicate.

Downlink and uplink resources may include time domain resources (frames, subframes, slots, and/or symbols), frequency domain resources (frequency bands, component carriers, subcarriers, resource blocks, and/or resource elements), and/or spatial domain resources (particular transmit directions and/or beam parameters). Frequency domain resources of some bands may be subdivided into bandwidth parts (BWPs). A BWP may be a continuous block of frequency domain resources (for example, a continuous block of resource blocks) that are allocated for one or more UEs 120. A UE 120 may be configured with both an uplink BWP and a downlink BWP (where the uplink BWP and the downlink BWP may be the same BWP or different BWPs). A BWP may be dynamically configured (for example, by a network node 110 transmitting a DCI configuration to the one or more UEs 120) and/or reconfigured, which means that a BWP can be adjusted in real-time (or near-real-time) based on changing network conditions in the wireless communication network 100 and/or based on the specific requirements of the one or more UEs 120. This enables more efficient use of the available frequency domain resources in the wireless communication network 100 because fewer frequency domain resources may be allocated to a BWP for a UE 120 (which may reduce the quantity of frequency domain resources that a UE 120 is required to monitor), leaving more frequency domain resources to be spread across multiple UEs 120. Thus, BWPs may also assist in the implementation of lower-capability UEs 120 by facilitating the configuration of smaller bandwidths for communication by such UEs 120.

As described above, in some aspects, the wireless communication network 100 may be, may include, or may be included in, an IAB network. In an IAB network, at least one network node 110 is an anchor network node that communicates with a core network. An anchor network node 110 may also be referred to as an IAB donor (or "IAB-donor"). The anchor network node 110 may connect to the core network via a wired backhaul link. For example, an Ng interface of the anchor network node 110 may terminate at the core network. Additionally or alternatively, an anchor network node 110 may connect to one or more devices of the core network that provide a core access and mobility management function (AMF). An IAB network also generally includes multiple non-anchor network nodes 110, which may also be referred to as relay network nodes or simply as IAB nodes (or "IAB-nodes"). Each non-anchor network node 110 may communicate directly with the anchor network node 110 via a wireless backhaul link to access the core network, or may communicate indirectly with the anchor network node 110 via one or more other non-anchor network nodes 110 and associated wireless backhaul links that form a backhaul path to the core network. Some anchor network node 110 or other non-anchor network node 110 may also communicate directly with one or more UEs 120 via wireless access links that carry access traffic. In some examples, network resources for wireless communication (such as time resources, frequency resources, and/or spatial resources) may be shared between access links and backhaul links.

In some examples, any network node 110 that relays communications may be referred to as a relay network node, a relay station, or simply as a relay. A relay may receive a transmission of a communication from an upstream station (for example, another network node 110 or a UE 120) and transmit the communication to a downstream station (for example, a UE 120 or another network node 110). In this case, the wireless communication network 100 may include or be referred to as a "multi-hop network." In the example shown in FIG. 1, the network node 110*d* (for example, a relay network node) may communicate with the network node 110*a* (for example, a macro network node) and the UE 120*d* in order to facilitate communication between the network node 110*a* and the UE 120*d*. Additionally or alternatively, a UE 120 may be or may operate as a relay station that can relay transmissions to or from other UEs 120. A UE 120 that relays communications may be referred to as a UE relay or a relay UE, among other examples.

The UEs 120 may be physically dispersed throughout the wireless communication network 100, and each UE 120 may be stationary or mobile. A UE 120 may be, may include, or may be included in an access terminal, another terminal, a mobile station, or a subscriber unit. A UE 120 may be, include, or be coupled with a cellular phone (for example, a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device, a biometric device, a wearable device (for example, a smart watch, smart clothing, smart glasses, a smart wristband, and/or smart jewelry, such as a smart ring or a smart bracelet), an entertainment device (for example, a music device, a video device, and/or a satellite radio), an XR device, a vehicular component or sensor, a smart meter or sensor, industrial manufacturing equipment, a Global Navigation Satellite System (GNSS) device (such as a Global Positioning System device or another type of positioning device), a UE function of a network node, and/or any other suitable device or function that may communicate via a wireless medium.

A UE 120 and/or a network node 110 may include one or more chips, system-on-chips (SoCs), chipsets, packages, or devices that individually or collectively constitute or comprise a processing system. The processing system includes processor (or "processing") circuitry in the form of one or multiple processors, microprocessors, processing units (such as central processing units (CPUs), graphics processing units (GPUs), neural processing units (NPUs) and/or digital signal processors (DSPs)), processing blocks, application-specific integrated circuits (ASIC), programmable logic devices (PLDs) (such as field programmable gate arrays (FPGAs)), or other discrete gate or transistor logic or circuitry (all of which may be generally referred to herein individually as "processors" or collectively as "the processor" or "the processor circuitry"). One or more of the processors may be individually or collectively configurable or configured to perform various functions or operations described herein. A group of processors collectively configurable or configured to perform a set of functions may include a first processor configurable or configured to perform a first function of the set and a second processor configurable or configured to perform a second function of the set, or may include the group of processors all being configured or configurable to perform the set of functions.

The processing system may further include memory circuitry in the form of one or more memory devices, memory blocks, memory elements or other discrete gate or transistor logic or circuitry, each of which may include tangible storage media such as random-access memory (RAM) or read-only memory (ROM), or combinations thereof (all of which may be generally referred to herein individually as "memories" or collectively as "the memory" or "the memory circuitry"). One or more of the memories may be coupled (for example, operatively coupled, communicatively coupled, electronically coupled, or electrically coupled) with one or more of the processors and may individually or collectively store processor-executable code (such as software) that, when executed by one or more of the processors, may configure one or more of the processors to perform various functions or operations described herein. Additionally or alternatively, in some examples, one or more of the processors may be preconfigured to perform various functions or operations described herein without requiring configuration by software. The processing system may further include or be coupled with one or more modems (such as a Wi-Fi (for example, Institute of Electrical and Electronics Engineers (IEEE) compliant) modem or a cellular (for example, 3GPP 4G LTE, 5G, or 6G compliant) modem). In some implementations, one or more processors of the processing system include or implement one or more of the modems. The processing system may further include or be coupled with multiple radios (collectively "the radio"), multiple RF chains, or multiple transceivers, each of which may in turn be coupled with one or more of multiple antennas. In some implementations, one or more processors of the processing system include or implement one or more of the radios, RF chains or transceivers. The UE 120 may include or may be included in a housing that houses components associated with the UE 120 including the processing system.

Some UEs 120 may be considered machine-type communication (MTC) UEs, evolved or enhanced machine-type communication (eMTC), UEs, further enhanced eMTC (feMTC) UEs, or enhanced feMTC (efeMTC) UEs, or further evolutions thereof, all of which may be simply referred to as "MTC UEs". An MTC UE may be, may include, or may be included in or coupled with a robot, an uncrewed aerial vehicle, a remote device, a sensor, a meter, a monitor, and/or a location tag. Some UEs 120 may be considered IoT devices and/or may be implemented as NB-IoT (narrowband IoT) devices. An IoT UE or NB-IoT device may be, may include, or may be included in or coupled with an industrial machine, an appliance, a refrigerator, a doorbell camera device, a home automation device, and/or a light fixture, among other examples. Some UEs 120 may be considered Customer Premises Equipment, which may include telecommunications devices that are installed at a customer location (such as a home or office) to enable access to a service provider's network (such as included in or in communication with the wireless communication network 100).

Some UEs 120 may be classified according to different categories in association with different complexities and/or different capabilities. UEs 120 in a first category may facilitate massive IoT in the wireless communication network 100, and may offer low complexity and/or cost relative to UEs 120 in a second category. UEs 120 in a second category may include mission-critical IoT devices, legacy UEs, baseline UEs, high-tier UEs, advanced UEs, full-capability UEs, and/or premium UEs that are capable of URLLC, eMBB, and/or precise positioning in the wireless communication network 100, among other examples. A third category of UEs 120 may have mid-tier complexity and/or capability (for example, a capability between UEs 120 of the first category and UEs 120 of the second capability). A UE 120 of the third category may be referred to as a reduced capacity UE ("RedCap UE"), a mid-tier UE, an NR-Light UE, and/or an NR-Lite UE, among other examples. RedCap UEs may bridge a gap between the capability and complexity of NB-IoT devices and/or eMTC UEs, and mission-critical IoT devices and/or premium UEs. RedCap UEs may include, for example, wearable devices, IoT devices, industrial sensors, and/or cameras that are associated with a limited bandwidth, power capacity, and/or transmission range, among other examples. RedCap UEs may support healthcare environments, building automation, electrical distribution, process automation, transport and logistics, and/or smart city deployments, among other examples.

In some examples, two or more UEs 120 (for example, shown as UE 120*a* and UE 120*c*) may communicate directly with one another using sidelink communications (for example, without communicating by way of a network node 110 as an intermediary). As an example, the UE 120*a* may directly transmit data, control information, or other signaling as a sidelink communication to the UE 120*c*. This is in contrast to, for example, the UE 120*a* first transmitting data in an UL communication to a network node 110, which then transmits the data to the UE 120*e* in a DL communication. In various examples, the UEs 120 may transmit and receive sidelink communications using peer-to-peer (P2P) communication protocols, device-to-device (D2D) communication protocols, vehicle-to-everything (V2X) communication protocols (which may include vehicle-to-vehicle (V2V) protocols, vehicle-to-infrastructure (V2I) protocols, and/or vehicle-to-pedestrian (V2P) protocols), and/or mesh network communication protocols. In some deployments and configurations, a network node 110 may schedule and/or allocate resources for sidelink communications between UEs 120 in the wireless communication network 100. In some other deployments and configurations, a UE 120 (instead of a network node 110) may perform, or collaborate or negotiate with one or more other UEs to perform, scheduling operations, resource selection operations, and/or other operations for sidelink communications.

In various examples, some of the network nodes 110 and the UEs 120 of the wireless communication network 100 may be configured for full-duplex operation in addition to half-duplex operation. A network node 110 or a UE 120 operating in a half-duplex mode may perform only one of transmission or reception during particular time resources, such as during particular slots, symbols, or other time periods. Half-duplex operation may involve time-division duplexing (TDD), in which DL transmissions of the network node 110 and UL transmissions of the UE 120 do not occur in the same time resources (that is, the transmissions do not overlap in time). In contrast, a network node 110 or a UE 120 operating in a full-duplex mode can transmit and receive communications concurrently (for example, in the same time resources). By operating in a full-duplex mode, network nodes 110 and/or UEs 120 may generally increase the capacity of the network and the radio access link. In some examples, full-duplex operation may involve frequency-division duplexing (FDD), in which DL transmissions of the network node 110 are performed in a first frequency band or on a first component carrier and transmissions of the UE 120 are performed in a second frequency band or on a second component carrier different than the first frequency band or the first component carrier, respectively. In some examples, full-duplex operation may be enabled for a UE 120 but not for a network node 110. For example, a UE 120 may simultaneously transmit an UL transmission to a first network node 110 and receive a DL transmission from a second network node 110 in the same time resources. In some other examples, full-duplex operation may be enabled for a network node 110 but not for a UE 120. For example, a network node 110 may simultaneously transmit a DL transmission to a first UE 120 and receive an UL transmission from a second UE 120 in the same time resources. In some other examples, full-duplex operation may be enabled for both a network node 110 and a UE 120.

In some examples, the UEs 120 and the network nodes 110 may perform MIMO communication. "MIMO" generally refers to transmitting or receiving multiple signals (such as multiple layers or multiple data streams) simultaneously over the same time and frequency resources. MIMO techniques generally exploit multipath propagation. MIMO may be implemented using various spatial processing or spatial multiplexing operations. In some examples, MIMO may support simultaneous transmission to multiple receivers, referred to as multi-user MIMO (MU-MIMO). Some RATs may employ advanced MIMO techniques, such as mTRP operation (including redundant transmission or reception on multiple TRPs), reciprocity in the time domain or the frequency domain, single-frequency-network (SFN) transmission, or non-coherent joint transmission (NC-JT).

In some aspects, the UE 120 may include a communication manager 140. As described in more detail elsewhere herein, the communication manager 140 may obtain an input sequence including a set of information bits and a set of frozen bits, the set of information bits associated with a set of information bit locations that satisfies a systematic encoding condition in accordance with a rate matching mode; encode the input sequence using a systematic polar encoder to obtain a systematic polar code that includes a first sequence of coded bits; perform a rate matching operation on the first sequence of coded bits in accordance with the rate matching mode to produce a second sequence of coded bits associated with the systematic polar code; and transmit the second sequence of coded bits associated with the systematic polar code in accordance with the rate matching mode. Additionally or alternatively, the communication manager 140 may perform one or more other operations described herein.

In some aspects, the network node 110 may include a communication manager 150. As described in more detail elsewhere herein, the communication manager 150 may obtain an input sequence including a set of information bits and a set of frozen bits, the set of information bits associated with a set of information bit locations that satisfies a systematic encoding condition in accordance with a rate matching mode; encode the input sequence using a systematic polar encoder to obtain a systematic polar code that includes a first sequence of coded bits; perform a rate matching operation on the first sequence of coded bits in accordance with the rate matching mode to produce a second sequence of coded bits associated with the systematic polar code; and transmit the second sequence of coded bits associated with the systematic polar code in accordance with the rate matching mode. Additionally or alternatively, the communication manager 150 may perform one or more other operations described herein.

Figure 2:
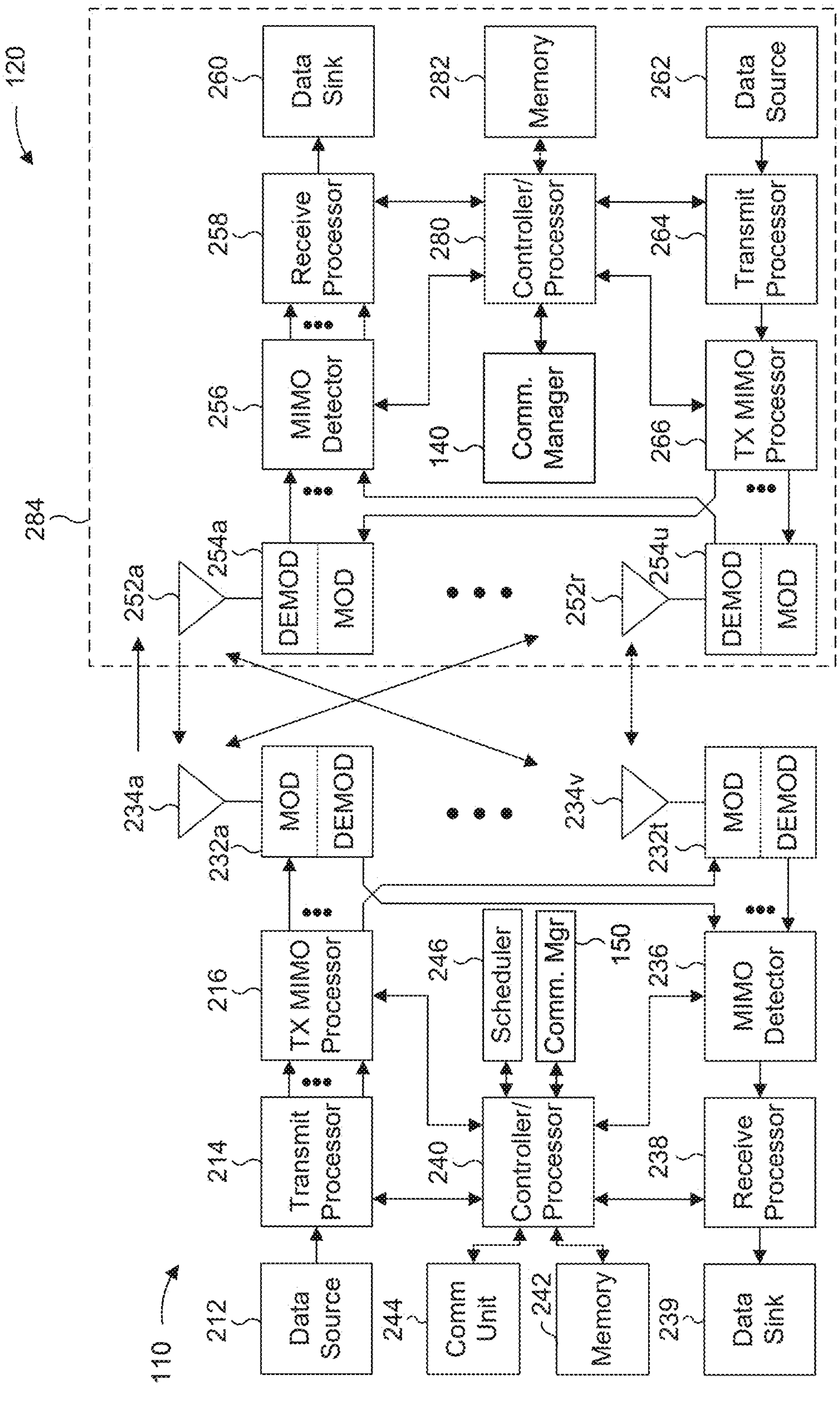
FIG. 2 is a diagram illustrating an example network node in communication with a user equipment (UE) in a wireless network in accordance with the present disclosure.

FIG. 2 is a diagram illustrating an example network node 110 in communication with an example UE 120 in a wireless network, in accordance with the present disclosure.

As shown in FIG. 2, the network node 110 may include a data source 212, a transmit processor 214, a transmit (TX) MIMO processor 216, a set of modems 232 (shown as 232*a* through 232*t*, where t≥1), a set of antennas 234 (shown as 234*a* through 234*v*, where v≥1), a MIMO detector 236, a receive processor 238, a data sink 239, a controller/processor 240, a memory 242, a communication unit 244, a scheduler 246, and/or a communication manager 150, among other examples. In some configurations, one or a combination of the antenna(s) 234, the modem(s) 232, the MIMO detector 236, the receive processor 238, the transmit processor 214, and/or the TX MIMO processor 216 may be included in a transceiver of the network node 110. The transceiver may be under control of and used by one or more processors, such as the controller/processor 240, and in some aspects in conjunction with processor-readable code stored in the memory 242, to perform aspects of the methods, processes, and/or operations described herein. In some aspects, the network node 110 may include one or more interfaces, communication components, and/or other components that facilitate communication with the UE 120 or another network node.

The terms "processor," "controller," or "controller/processor" may refer to one or more controllers and/or one or more processors. For example, reference to "a/the processor," "a/the controller/processor," or the like (in the singular) should be understood to refer to any one or more of the processors described in connection with FIG. 2, such as a single processor or a combination of multiple different processors. Reference to "one or more processors" should be understood to refer to any one or more of the processors described in connection with FIG. 2. For example, one or more processors of the network node 110 may include transmit processor 214, TX MIMO processor 216, MIMO detector 236, receive processor 238, and/or controller/processor 240. Similarly, one or more processors of the UE 120 may include MIMO detector 256, receive processor 258, transmit processor 264, TX MIMO processor 266, and/or controller/processor 280.

In some aspects, a single processor may perform all of the operations described as being performed by the one or more processors. In some aspects, a first set of (one or more) processors of the one or more processors may perform a first operation described as being performed by the one or more processors, and a second set of (one or more) processors of the one or more processors may perform a second operation described as being performed by the one or more processors. The first set of processors and the second set of processors may be the same set of processors or may be different sets of processors. Reference to "one or more memories" should be understood to refer to any one or more memories of a corresponding device, such as the memory described in connection with FIG. 2. For example, operation described as being performed by one or more memories can be performed by the same subset of the one or more memories or different subsets of the one or more memories.

For downlink communication from the network node 110 to the UE 120, the transmit processor 214 may receive data ("downlink data") intended for the UE 120 (or a set of UEs that includes the UE 120) from the data source 212 (such as a data pipeline or a data queue). In some examples, the transmit processor 214 may select one or more modulation and coding schemes (MCSs) for the UE 120 in accordance with one or more channel quality indicators (CQIs) received from the UE 120. The network node 110 may process the data (for example, including encoding the data) for transmission to the UE 120 on a downlink in accordance with the MCS(s) selected for the UE 120 to generate data symbols. The transmit processor 214 may process system information (for example, semi-static resource partitioning information (SRPI)) and/or control information (for example, CQI requests, grants, and/or upper layer signaling) and provide overhead symbols and/or control symbols. The transmit processor 214 may generate reference symbols for reference signals (for example, a cell-specific reference signal (CRS), a demodulation reference signal (DMRS), or a channel state information (CSI) reference signal (CSI-RS)) and/or synchronization signals (for example, a primary synchronization signal (PSS) or a secondary synchronization signals (SSS)).

The TX MIMO processor 216 may perform spatial processing (for example, precoding) on the data symbols, the control symbols, the overhead symbols, and/or the reference symbols, if applicable, and may provide a set of output symbol streams (for example, T output symbol streams) to the set of modems 232. For example, each output symbol stream may be provided to a respective modulator component (shown as MOD) of a modem 232. Each modem 232 may use the respective modulator component to process (for example, to modulate) a respective output symbol stream (for example, for orthogonal frequency division multiplexing (OFDM)) to obtain an output sample stream. Each modem 232 may further use the respective modulator component to process (for example, convert to analog, amplify, filter, and/or upconvert) the output sample stream to obtain a time domain downlink signal. The modems 232*a* through 232*t* may together transmit a set of downlink signals (for example, T downlink signals) via the corresponding set of antennas 234.

A downlink signal may include a DCI communication, a MAC control element (MAC-CE) communication, an RRC communication, a downlink reference signal, or another type of downlink communication. Downlink signals may be transmitted on a PDCCH, a PDSCH, and/or on another downlink channel. A downlink signal may carry one or more transport blocks (TBs) of data. A TB may be a unit of data that is transmitted over an air interface in the wireless communication network 100. A data stream (for example, from the data source 212) may be encoded into multiple TBs for transmission over the air interface. The quantity of TBs used to carry the data associated with a particular data stream may be associated with a TB size common to the multiple TBs. The TB size may be based on or otherwise associated with radio channel conditions of the air interface, the MCS used for encoding the data, the downlink resources allocated for transmitting the data, and/or another parameter. In general, the larger the TB size, the greater the amount of data that can be transmitted in a single transmission, which reduces signaling overhead. However, larger TB sizes may be more prone to transmission and/or reception errors than smaller TB sizes, but such errors may be mitigated by more robust error correction techniques.

For uplink communication from the UE 120 to the network node 110, uplink signals from the UE 120 may be received by an antenna 234, may be processed by a modem 232 (for example, a demodulator component, shown as DEMOD, of a modem 232), may be detected by the MIMO detector 236 (for example, a receive (Rx) MIMO processor) if applicable, and/or may be further processed by the receive processor 238 to obtain decoded data and/or control information. The receive processor 238 may provide the decoded data to a data sink 239 (which may be a data pipeline, a data queue, and/or another type of data sink) and provide the decoded control information to a processor, such as the controller/processor 240.

The network node 110 may use the scheduler 246 to schedule one or more UEs 120 for downlink or uplink communications. In some aspects, the scheduler 246 may use DCI to dynamically schedule DL transmissions to the UE 120 and/or UL transmissions from the UE 120. In some examples, the scheduler 246 may allocate recurring time domain resources and/or frequency domain resources that the UE 120 may use to transmit and/or receive communications using an RRC configuration (for example, a semi-static configuration), for example, to perform semi-persistent scheduling (SPS) or to configure a configured grant (CG) for the UE 120.

One or more of the transmit processor 214, the TX MIMO processor 216, the modem 232, the antenna 234, the MIMO detector 236, the receive processor 238, and/or the controller/processor 240 may be included in an RF chain of the network node 110. An RF chain may include one or more filters, mixers, oscillators, amplifiers, analog-to-digital converters (ADCs), and/or other devices that convert between an analog signal (such as for transmission or reception via an air interface) and a digital signal (such as for processing by one or more processors of the network node 110). In some aspects, the RF chain may be or may be included in a transceiver of the network node 110.

In some examples, the network node 110 may use the communication unit 244 to communicate with a core network and/or with other network nodes. The communication unit 244 may support wired and/or wireless communication protocols and/or connections, such as Ethernet, optical fiber, common public radio interface (CPRI), and/or a wired or wireless backhaul, among other examples. The network node 110 may use the communication unit 244 to transmit and/or receive data associated with the UE 120 or to perform network control signaling, among other examples. The communication unit 244 may include a transceiver and/or an interface, such as a network interface.

The UE 120 may include a set of antennas 252 (shown as antennas 252*a* through 252*r*, where r≥1), a set of modems 254 (shown as modems 254*a* through 254*u*, where u≥1), a MIMO detector 256, a receive processor 258, a data sink 260, a data source 262, a transmit processor 264, a TX MIMO processor 266, a controller/processor 280, a memory 282, and/or a communication manager 140, among other examples. One or more of the components of the UE 120 may be included in a housing 284. In some aspects, one or a combination of the antenna(s) 252, the modem(s) 254, the MIMO detector 256, the receive processor 258, the transmit processor 264, or the TX MIMO processor 266 may be included in a transceiver that is included in the UE 120. The transceiver may be under control of and used by one or more processors, such as the controller/processor 280, and in some aspects in conjunction with processor-readable code stored in the memory 282, to perform aspects of the methods, processes, or operations described herein. In some aspects, the UE 120 may include another interface, another communication component, and/or another component that facilitates communication with the network node 110 and/or another UE 120.

For downlink communication from the network node 110 to the UE 120, the set of antennas 252 may receive the downlink communications or signals from the network node 110 and may provide a set of received downlink signals (for example, R received signals) to the set of modems 254. For example, each received signal may be provided to a respective demodulator component (shown as DEMOD) of a modem 254. Each modem 254 may use the respective demodulator component to condition (for example, filter, amplify, downconvert, and/or digitize) a received signal to obtain input samples. Each modem 254 may use the respective demodulator component to further demodulate or process the input samples (for example, for OFDM) to obtain received symbols. The MIMO detector 256 may obtain received symbols from the set of modems 254, may perform MIMO detection on the received symbols if applicable, and may provide detected symbols. The receive processor 258 may process (for example, decode) the detected symbols, may provide decoded data for the UE 120 to the data sink 260 (which may include a data pipeline, a data queue, and/or an application executed on the UE 120), and may provide decoded control information and system information to the controller/processor 280.

For uplink communication from the UE 120 to the network node 110, the transmit processor 264 may receive and process data ("uplink data") from a data source 262 (such as a data pipeline, a data queue, and/or an application executed on the UE 120) and control information from the controller/processor 280. The control information may include one or more parameters, feedback, one or more signal measurements, and/or other types of control information. In some aspects, the receive processor 258 and/or the controller/processor 280 may determine, for a received signal (such as received from the network node 110 or another UE), one or more parameters relating to transmission of the uplink communication. The one or more parameters may include a reference signal received power (RSRP) parameter, a received signal strength indicator (RSSI) parameter, a reference signal received quality (RSRQ) parameter, a CQI parameter, or a transmit power control (TPC) parameter, among other examples. The control information may include an indication of the RSRP parameter, the RSSI parameter, the RSRQ parameter, the CQI parameter, the TPC parameter, and/or another parameter. The control information may facilitate parameter selection and/or scheduling for the UE 120 by the network node 110.

The transmit processor 264 may generate reference symbols for one or more reference signals, such as an uplink DMRS, an uplink sounding reference signal (SRS), and/or another type of reference signal. The symbols from the transmit processor 264 may be precoded by the TX MIMO processor 266, if applicable, and further processed by the set of modems 254 (for example, for DFT-s-OFDM or CP-OFDM). The TX MIMO processor 266 may perform spatial processing (for example, precoding) on the data symbols, the control symbols, the overhead symbols, and/or the reference symbols, if applicable, and may provide a set of output symbol streams (for example, U output symbol streams) to the set of modems 254. For example, each output symbol stream may be provided to a respective modulator component (shown as MOD) of a modem 254. Each modem 254 may use the respective modulator component to process (for example, to modulate) a respective output symbol stream (for example, for OFDM) to obtain an output sample stream. Each modem 254 may further use the respective modulator component to process (for example, convert to analog, amplify, filter, and/or upconvert) the output sample stream to obtain an uplink signal.

The modems 254*a* through 254*u* may transmit a set of uplink signals (for example, R uplink signals or U uplink symbols) via the corresponding set of antennas 252. An uplink signal may include a UCI communication, a MAC-CE communication, an RRC communication, or another type of uplink communication. Uplink signals may be transmitted on a PUSCH, a PUCCH, and/or another type of uplink channel. An uplink signal may carry one or more TBs of data. Sidelink data and control transmissions (that is, transmissions directly between two or more UEs 120) may generally use similar techniques as were described for uplink data and control transmission, and may use sidelink-specific channels such as a physical sidelink shared channel (PSSCH), a physical sidelink control channel (PSCCH), and/or a physical sidelink feedback channel (PSFCH).

One or more antennas of the set of antennas 252 or the set of antennas 234 may include, or may be included within, one or more antenna panels, one or more antenna groups, one or more sets of antenna elements, or one or more antenna arrays, among other examples. An antenna panel, an antenna group, a set of antenna elements, or an antenna array may include one or more antenna elements (within a single housing or multiple housings), a set of coplanar antenna elements, a set of non-coplanar antenna elements, or one or more antenna elements coupled with one or more transmission or reception components, such as one or more components of FIG. 2. As used herein, "antenna" can refer to one or more antennas, one or more antenna panels, one or more antenna groups, one or more sets of antenna elements, or one or more antenna arrays. "Antenna panel" can refer to a group of antennas (such as antenna elements) arranged in an array or panel, which may facilitate beamforming by manipulating parameters of the group of antennas. "Antenna module" may refer to circuitry including one or more antennas, which may also include one or more other components (such as filters, amplifiers, or processors) associated with integrating the antenna module into a wireless communication device.

In some examples, each of the antenna elements of an antenna 234 or an antenna 252 may include one or more sub-elements for radiating or receiving radio frequency signals. For example, a single antenna element may include a first sub-element cross-polarized with a second sub-element that can be used to independently transmit cross-polarized signals. The antenna elements may include patch antennas, dipole antennas, and/or other types of antennas arranged in a linear pattern, a two-dimensional pattern, or another pattern. A spacing between antenna elements may be such that signals with a desired wavelength transmitted separately by the antenna elements may interact or interfere constructively and destructively along various directions (such as to form a desired beam). For example, given an expected range of wavelengths or frequencies, the spacing may provide a quarter wavelength, a half wavelength, or another fraction of a wavelength of spacing between neighboring antenna elements to allow for the desired constructive and destructive interference patterns of signals transmitted by the separate antenna elements within that expected range.

The amplitudes and/or phases of signals transmitted via antenna elements and/or sub-elements may be modulated and shifted relative to each other (such as by manipulating phase shift, phase offset, and/or amplitude) to generate one or more beams, which is referred to as beamforming. The term "beam" may refer to a directional transmission of a wireless signal toward a receiving device or otherwise in a desired direction. "Beam" may also generally refer to a direction associated with such a directional signal transmission, a set of directional resources associated with the signal transmission (for example, an angle of arrival, a horizontal direction, and/or a vertical direction), and/or a set of parameters that indicate one or more aspects of a directional signal, a direction associated with the signal, and/or a set of directional resources associated with the signal. In some implementations, antenna elements may be individually selected or deselected for directional transmission of a signal (or signals) by controlling amplitudes of one or more corresponding amplifiers and/or phases of the signal(s) to form one or more beams. The shape of a beam (such as the amplitude, width, and/or presence of side lobes) and/or the direction of a beam (such as an angle of the beam relative to a surface of an antenna array) can be dynamically controlled by modifying the phase shifts, phase offsets, and/or amplitudes of the multiple signals relative to each other.

Different UEs 120 or network nodes 110 may include different numbers of antenna elements. For example, a UE 120 may include a single antenna element, two antenna elements, four antenna elements, eight antenna elements, or a different number of antenna elements. As another example, a network node 110 may include eight antenna elements, 24 antenna elements, 64 antenna elements, 128 antenna elements, or a different number of antenna elements. Generally, a larger number of antenna elements may provide increased control over parameters for beam generation relative to a smaller number of antenna elements, whereas a smaller number of antenna elements may be less complex to implement and may use less power than a larger number of antenna elements. Multiple antenna elements may support multiple-layer transmission, in which a first layer of a communication (which may include a first data stream) and a second layer of a communication (which may include a second data stream) are transmitted using the same time and frequency resources with spatial multiplexing.

Figure 3:
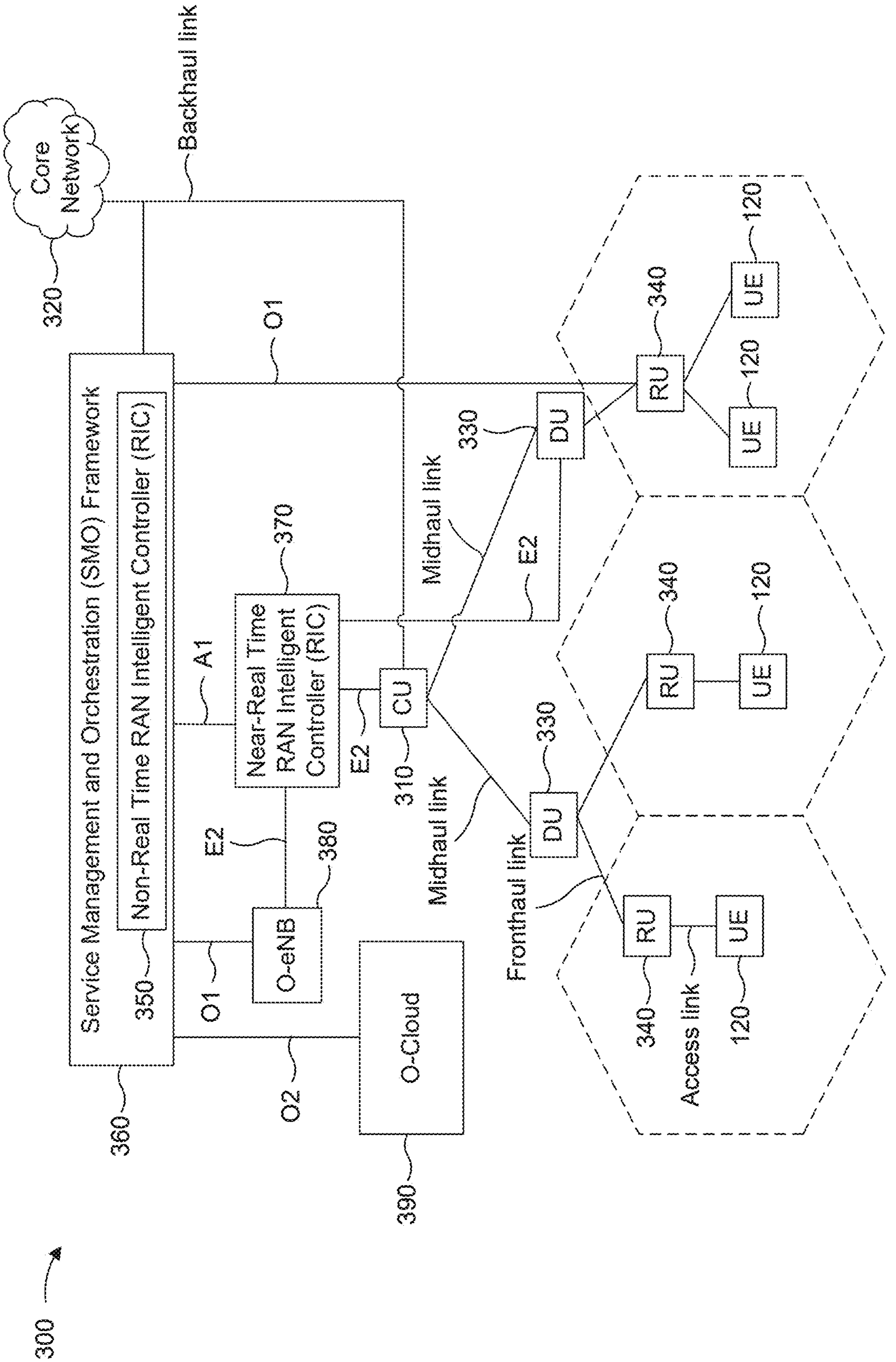
FIG. 3 is a diagram illustrating an example disaggregated base station architecture in accordance with the present disclosure.

FIG. 3 is a diagram illustrating an example disaggregated base station architecture 300, in accordance with the present disclosure. One or more components of the example disaggregated base station architecture 300 may be, may include, or may be included in one or more network nodes (such one or more network nodes 110). The disaggregated base station architecture 300 may include a CU 310 that can communicate directly with a core network 320 via a backhaul link, or that can communicate indirectly with the core network 320 via one or more disaggregated control units, such as a Non-RT RIC 350 associated with a Service Management and Orchestration (SMO) Framework 360 and/or a Near-RT RIC 370 (for example, via an E2 link). The CU 310 may communicate with one or more DUs 330 via respective midhaul links, such as via F1 interfaces. Each of the DUs 330 may communicate with one or more RUs 340 via respective fronthaul links. Each of the RUs 340 may communicate with one or more UEs 120 via respective RF access links. In some deployments, a UE 120 may be simultaneously served by multiple RUs 340.

Each of the components of the disaggregated base station architecture 300, including the CUS 310, the DUs 330, the RUs 340, the Near-RT RICs 370, the Non-RT RICs 350, and the SMO Framework 360, may include one or more interfaces or may be coupled with one or more interfaces for receiving or transmitting signals, such as data or information, via a wired or wireless transmission medium.

In some aspects, the CU 310 may be logically split into one or more CU user plane (CU-UP) units and one or more CU control plane (CU-CP) units. A CU-UP unit may communicate bidirectionally with a CU-CP unit via an interface, such as the E1 interface when implemented in an O-RAN configuration. The CU 310 may be deployed to communicate with one or more DUs 330, as necessary, for network control and signaling. Each DU 330 may correspond to a logical unit that includes one or more base station functions to control the operation of one or more RUs 340. For example, a DU 330 may host various layers, such as an RLC layer, a MAC layer, or one or more PHY layers, such as one or more high PHY layers or one or more low PHY layers. Each layer (which also may be referred to as a module) may be implemented with an interface for communicating signals with other layers (and modules) hosted by the DU 330, or for communicating signals with the control functions hosted by the CU 310. Each RU 340 may implement lower layer functionality. In some aspects, real-time and non-real-time aspects of control and user plane communication with the RU(s) 340 may be controlled by the corresponding DU 330.

The SMO Framework 360 may support RAN deployment and provisioning of non-virtualized and virtualized network elements. For non-virtualized network elements, the SMO Framework 360 may support the deployment of dedicated physical resources for RAN coverage requirements, which may be managed via an operations and maintenance interface, such as an O1 interface. For virtualized network elements, the SMO Framework 360 may interact with a cloud computing platform (such as an open cloud (O-Cloud) platform 390) to perform network element life cycle management (such as to instantiate virtualized network elements) via a cloud computing platform interface, such as an O2 interface. A virtualized network element may include, but is not limited to, a CU 310, a DU 330, an RU 340, a non-RT RIC 350, and/or a Near-RT RIC 370. In some aspects, the SMO Framework 360 may communicate with a hardware aspect of a 4G RAN, a 5G NR RAN, and/or a 6G RAN, such as an open eNB (O-cNB) 380, via an O1 interface. Additionally or alternatively, the SMO Framework 360 may communicate directly with each of one or more RUs 340 via a respective O1 interface. In some deployments, this configuration can enable each DU 330 and the CU 310 to be implemented in a cloud-based RAN architecture, such as a vRAN architecture.

The Non-RT RIC 350 may include or may implement a logical function that enables non-real-time control and optimization of RAN elements and resources, AI/ML workflows including model training and updates, and/or policy-based guidance of applications and/or features in the Near-RT RIC 370. The Non-RT RIC 350 may be coupled to or may communicate with (such as via an A1 interface) the Near-RT RIC 370. The Near-RT RIC 370 may include or may implement a logical function that enables near-real-time control and optimization of RAN elements and resources via data collection and actions via an interface (such as via an E2 interface) connecting one or more CUs 310, one or more DUs 330, and/or an O-eNB with the Near-RT RIC 370.

In some aspects, to generate AI/ML models to be deployed in the Near-RT RIC 370, the Non-RT RIC 350 may receive parameters or external enrichment information from external servers. Such information may be utilized by the Near-RT RIC 370 and may be received at the SMO Framework 360 or the Non-RT RIC 350 from non-network data sources or from network functions. In some examples, the Non-RT RIC 350 or the Near-RT RIC 370 may tune RAN behavior or performance. For example, the Non-RT RIC 350 may monitor long-term trends and patterns for performance and may employ AI/ML models to perform corrective actions via the SMO Framework 360 (such as reconfiguration via an O1 interface) or via creation of RAN management policies (such as A1 interface policies).

The network node 110, the controller/processor 240 of the network node 110, the UE 120, the controller/processor 280 of the UE 120, the CU 310, the DU 330, the RU 340, or any other component(s) of FIG. 1, 2, or 3 may implement one or more techniques or perform one or more operations associated with rate matching and bit freezing for systematic polar codes, as described in more detail elsewhere herein. For example, the controller/processor 240 of the network node 110, the controller/processor 280 of the UE 120, any other component(s) of FIG. 2, the CU 310, the DU 330, or the RU 340 may perform or direct operations of, for example, process 800 of FIG. 8 or other processes as described herein (alone or in conjunction with one or more other processors). The memory 242 may store data and program codes for the network node 110, the network node 110, the CU 310, the DU 330, or the RU 340. The memory 282 may store data and program codes for the UE 120. In some examples, the memory 242 or the memory 282 may include a non-transitory computer-readable medium storing a set of instructions (for example, code or program code) for wireless communication. The memory 242 may include one or more memories, such as a single memory or multiple different memories (of the same type or of different types). The memory 282 may include one or more memories, such as a single memory or multiple different memories (of the same type or of different types). For example, the set of instructions, when executed (for example, directly, or after compiling, converting, or interpreting) by one or more processors of the network node 110, the UE 120, the CU 310, the DU 330, or the RU 340, may cause the one or more processors to perform process 800 of FIG. 8 or other processes as described herein. In some examples, executing instructions may include running the instructions, converting the instructions, compiling the instructions, and/or interpreting the instructions, among other examples.

In some aspects, the UE 120 includes means for obtaining an input sequence including a set of information bits and a set of frozen bits, the set of information bits associated with a set of information bit locations that satisfies a systematic encoding condition in accordance with a rate matching mode; means for encoding the input sequence using a systematic polar encoder to obtain a systematic polar code that includes a first sequence of coded bits; and/or means for performing a rate matching operation on the first sequence of coded bits in accordance with the rate matching mode to produce a second sequence of coded bits associated with the systematic polar code; means for transmitting the second sequence of coded bits associated with the systematic polar code in accordance with the rate matching mode. In some aspects, the means for the UE 120 to perform operations described herein may include, for example, one or more of communication manager 140, antenna 252, modem 254, MIMO detector 256, receive processor 258, transmit processor 264, TX MIMO processor 266, controller/processor 280, or memory 282.

In some aspects, the network node 110 includes means for obtaining an input sequence including a set of information bits and a set of frozen bits, the set of information bits associated with a set of information bit locations that satisfies a systematic encoding condition in accordance with a rate matching mode; means for encoding the input sequence using a systematic polar encoder to obtain a systematic polar code that includes a first sequence of coded bits; means for performing a rate matching operation on the first sequence of coded bits in accordance with the rate matching mode to produce a second sequence of coded bits associated with the systematic polar code; and/or means for transmitting the second sequence of coded bits associated with the systematic polar code in accordance with the rate matching mode. In some aspects, the means for the network node 110 to perform operations described herein may include, for example, one or more of communication manager 150, transmit processor 214, TX MIMO processor 216, modem 232, antenna 234, MIMO detector 236, receive processor 238, controller/processor 240, memory 242, or scheduler 246.

Figure 4:
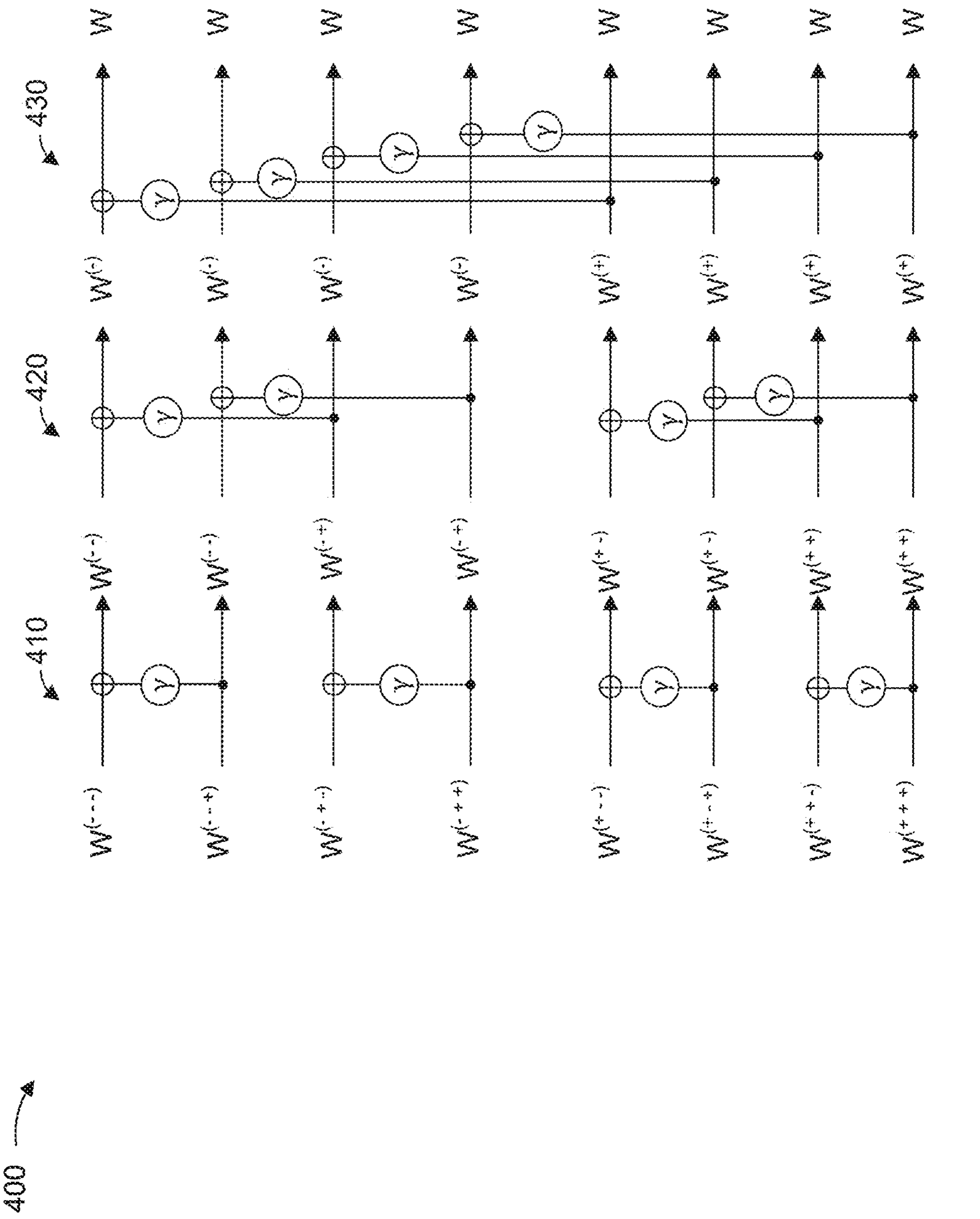
FIG. 4 is a diagram illustrating an example of a polar encoding operation in accordance with the present disclosure.

FIG. 4 is a diagram illustrating an example of a polar encoding operation 400 in accordance with the present disclosure. More particularly, as described herein, wireless communications, such as control channel communications, may be encoded using polar coding to improve resilience to non-ideal channel conditions. Polar encoding may generally involve recursively constructing a codeword c having a length N. In some examples, encoding with an ($N=2^m$, K) code defined over a Galois Field (GF) with four elements (GF(4)), the codeword $$c = u\begin{pmatrix} 1 & 0 \\ \gamma & 1 \end{pmatrix}^{\otimes m},$$

where $u_i$, $c_i \in GF(4)$, $\gamma$ is an element of GF(4) not equal to 0 or 1, and i is an integer, $i \in [0, N-1]$. A symbol $u_i$ of an encoded communication may carry information (for example, a two-bit payload in GF(4) or a one-bit payload in GF(2)) or may be frozen (for example, having a fixed value, such as $u_i=0$). N may be referred to herein as a value defining a plurality of symbols of the encoded communication. In the binary case (GF(2)), $\gamma=1$.

The matrix $$\begin{pmatrix} 1 & 0 \\ \gamma & 1 \end{pmatrix}^{\otimes m}$$

may polarize $2^m$ copies of a channel W into subchannels $W^{(i)}$, which may be almost noisy (for example, $I(W^{(i)})\rightarrow 0$) or almost noiseless (for example, I $(W^{(i)})\rightarrow 2$). As an example, subchannels $W^{(i)}$ may be polarized into highly reliable (for example, low noise) subchannels $W^{(i)}$ and highly unreliable (for example, noisy) subchannels $W^{(i)}$. For example, for GF(4), the capacities of the subchannels $W^{(i)}$, $I(W^{(i)})$, may approach two for highly reliable subchannels $W^{(i)}$ and 0 for highly unreliable subchannels $W^{(i)}$. If GF(2), $\gamma=1$, and subchannels $W^{(i)}$ may be present where the capacities $I(W^{(i)})$ approach one (for example, $I(W^{(i)})\rightarrow 1$).

Polar coding provides for a set of information symbols or information bits $i_0, \ldots i_{K-1}$ to be mapped to reliable symbol positions (referred to as information bit locations) and for unreliable symbols (in frozen locations) to be replaced with frozen symbols. For example, the information symbols $i_0, \ldots i_{K-1}$ may correspond to the K largest capacities $I(W^{(i)})$. For example, a transmitter may transmit the information symbols $i_0, \ldots i_{K-1}$ through the subchannels $W^{(i)}$ that have the K largest capacities $I(W^{(i)})$.

The polar encoding operation 400 may include coupling a plurality of subchannels $W^{(i)}$ over multiple phases 410-430. Phase 410 involves coupling neighboring subchannels $W^{(i)}$. Phase 420 involves coupling subchannels $W^{(i)}$ separated by one subchannel $W^{(i)}$. Phase 430 involves coupling subchannels $W^{(i)}$ separated by three subchannels $W^{(i)}$. Polar decoding may involve performing the polar encoding operation 400 in reverse (for example, starting with phase 430, which is followed by phase 420, which is followed by phase 410).

Polar coding is described herein with reference to a general polarization kernel $$G = \begin{pmatrix} 1 & 0 \\ \gamma & 1 \end{pmatrix},$$

where for GF(4), $\gamma \in \{1, \alpha, \alpha^2\}$, and a is the primitive element of $GF(2^2)$. Thus, the elements of $GF(2^2)$ may include $\{0, 1, \alpha, \alpha^2=\alpha+1\}$, which may be considered as the elements {00, 01, 10, 11} of a two-dimensional vector space over GF(2). The summation of the elements may be defined coordinate-wise (for example, where each coordinate is a single bit), and for multiplication of the elements, the following properties may be used: $0\cdot x=0$, $1\cdot x=x$, and $\alpha^3=1$. As described herein, for encoding in nonbinary polar coding, a recursive structure $$\begin{pmatrix} 1 & 0 \\ \gamma & 1 \end{pmatrix}^{\otimes m}$$

may be used. For GF(2), the polarization kernel $$G = \begin{pmatrix} 1 & 0 \\ 1 & 1 \end{pmatrix}$$

and for encoding in binary polar coding, a recursive structure $$\begin{pmatrix} 1 & 0 \\ 1 & 1 \end{pmatrix}^{\otimes m}$$

may be used. Furthermore, an N×N polarization kernel may be denoted $$G = \begin{bmatrix} 1 & 1 \\ 1 & 0 \end{bmatrix}^{\otimes m},$$

where $m=\log_2 N$.

Figure 5:
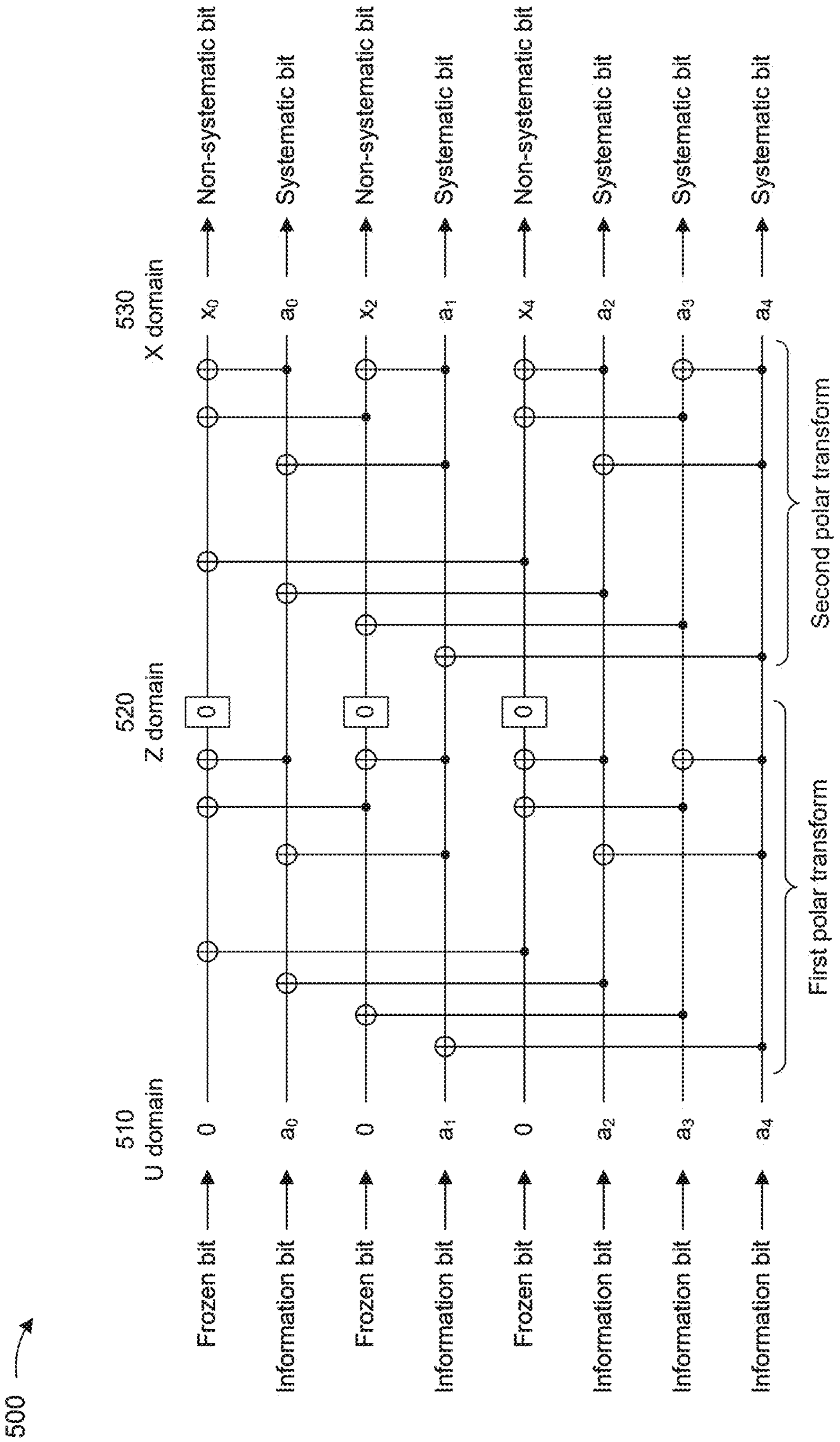
FIG. 5 is a diagram illustrating an example of a systematic polar encoding operation in accordance with the present disclosure.

FIG. 5 is a diagram illustrating an example 500 of a systematic polar encoding operation in accordance with the present disclosure. More particularly, a wireless network may support polar codes to implement channel coding for downlink and/or uplink control channel communications, where polar coding is a linear block coding technique that has provable capacity-achieving performance over binary channels with polynomial complexity in various scenarios (such as channel coding, among others). As described herein, polar coding has a built-in channel polarization structure that uses a recursive construction to split (or "polarize") a communication channel into reliable (almost completely noiseless) subchannels that are very good for transmitting information and unreliable (almost completely noisy) subchannels that are very bad for transmitting information. During polar encoding, a polar transform is applied to assign information bits to the reliable subchannels and to assign "frozen" or "fixed" bits (for example, "0" bits) to the unreliable subchannels.

In a standard form, polar codes are non-systematic, in that a codeword transmitted over a channel differs from the original data input to the polar encoder (for example, the information bits do not appear in the codeword transparently). For example, when using a polar code to transmit raw data with the value "0101", the raw data may have a different form, such as "1100", in the codeword transmitted over the channel. In contrast, in a systematic code, the codeword (after encoding) contains the raw information bits (for example, in a systematic code, raw data with the value "0101" appears as "0101" plus one or more parity bits). In some wireless networks, the (standard) non-systematic form of polar codes are adopted. However, there are various circumstances where systematic encoding provides meaningful performance benefits while preserving low-complexity.

For example, although systematic polar codes and non-systematic polar codes have the same block error rate (BLER) for binary uniform sources (where "0" bits and "1" bits appear with a roughly equal probability in a sequence of information bits to be encoded), systematic polar codes tend to have a better BER. Furthermore, systematic polar codes may be significantly more effective in exploiting side information about a source relative to non-systematic polar codes. For example, in contrast to use cases where a receiver has no prior knowledge regarding whether a given bit is a "0" or a "1", there are various scenarios, where the receiver may have access to side information about information bit values. For example, in control channel communications (that often use polar codes), certain fields may have values that do not change over multiple consecutive transmissions. In such cases, when some information bits have the same value over multiple consecutive transmissions, a receiver can predict a likelihood that the information bits have the same value(s) as a previous transmission. Accordingly, when values for certain transmitted bits can be predicted with a high probability (for example, in AI/ML applications or other data-driven systems or coding designs), systematic polar codes may provide advantages over non-systematic polar codes.

In principle, any non-systematic linear code can be converted to a systematic linear code (for example, through Gaussian elimination, by inverting a portion of a generator matrix used to encode the non-systematic linear code). Accordingly, because a polar code is a linear code, a non-systematic polar code can be converted to a systematic linear code. However, performing a Gaussian elimination to convert a polar code from a non-systematic form to a systematic form may have a high complexity if an encoder does not exploit any structure associated with the non-systematic polar code. For example, the complexity to perform a Gaussian elimination to convert a polar code from a non-systematic form to a systematic form is $N^3$, where N is a block length of the polar code. However, a polar code has a property that results in a systematic encoding when two non-systematic polar encodings are concatenated. Accordingly, a systematic encoding can be achieved for a polar code by exploiting the fact that G×G=1, where G is a non-systematic polar transform and/is an identity matrix (for example, the non-systematic polar transform G is an involution). In this way, a systematic polar code can be implemented by performing a non-systematic polar encoding twice.

For example, as shown in FIG. 5, a systematic polar encoder may receive an input sequence in a U domain 510 (or input domain), where the input sequence includes a set of information bits $\alpha_0, \ldots \alpha_{K-1}$ (for example, $\alpha_0, \ldots \alpha_4$ in example 500) and a set of frozen bits that are typically set to 0. Accordingly, the input sequence may be input to a first polar transform, which may yield a typical non-systematic codeword in a Z domain 520 (or intermediate domain). As further shown in FIG. 5, in the Z domain 520, the bits in the frozen bit locations are reset to 0 and the bits in the information bit locations remain unchanged, which results in an intermediate vector in the Z domain 520 having the same length as the input sequence in the U domain 510. As further shown, the intermediate vector is then input to the second polar transform, which results in a codeword in an X domain 530 (or output domain) containing systematic bits at the same locations as the information bits in the U domain 510 (provided that the information sequence satisfies certain algebraic properties, as described herein in connection with FIGS. 7A-7B). Furthermore, the codeword in the X domain 530 contains parity bits in the frozen bit locations. Accordingly, the systematic polar encoding technique shown in FIG. 5 has a very low complexity for converting a polar code from a non-systematic to a systematic form. Furthermore, there is a low complexity at a decoder, which first decodes the systematic polar code in the X domain 530 using a conventional decoder (for example, a successive cancellation list (SCL) decoder) to decode the intermediate bits in the Z domain 520, denoted $z_0, \ldots, z_{K-1}$. The decoder may then convert the intermediate bits to the U domain 510 to obtain the information bits using the polar transform.

Figure 6:
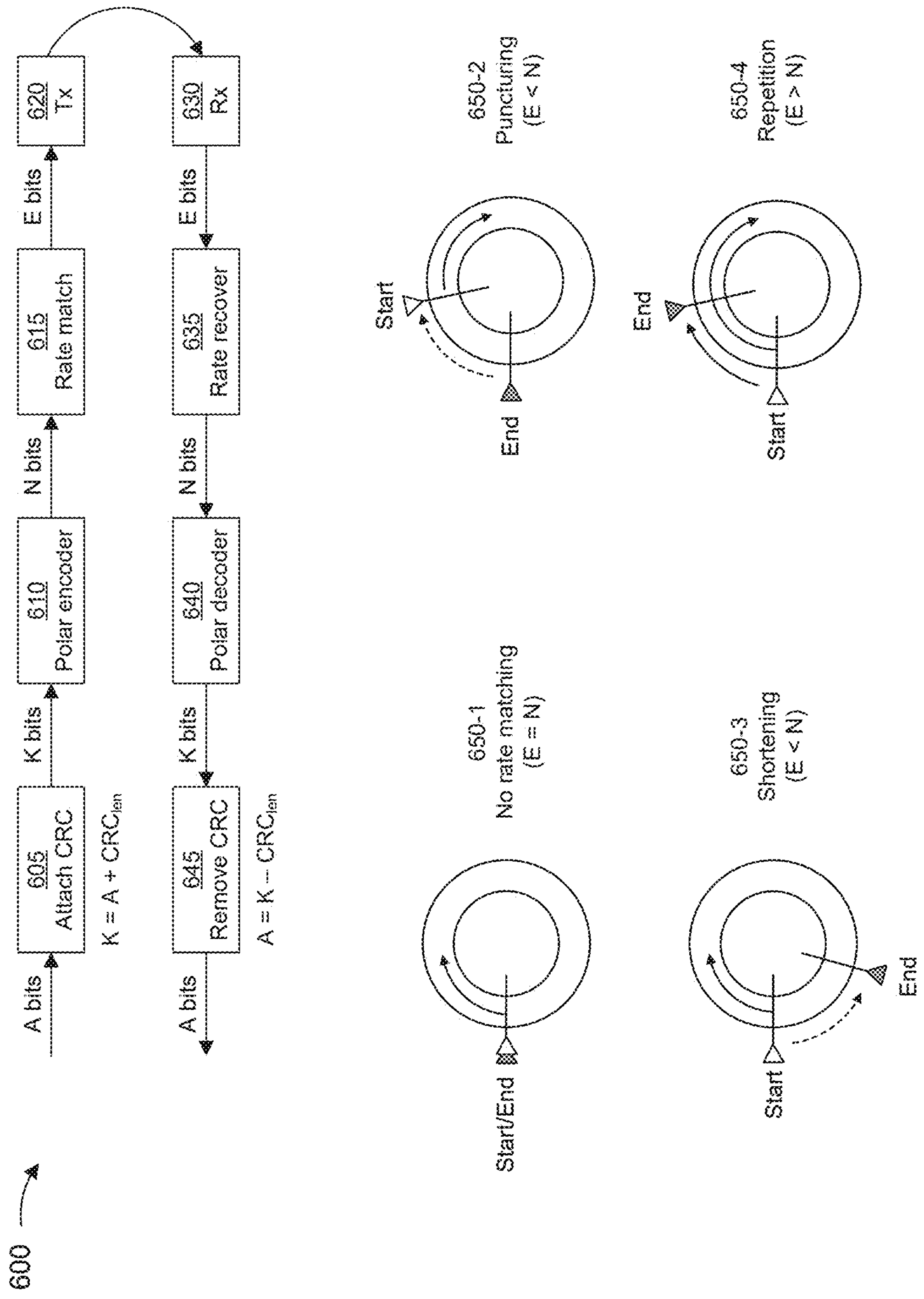
FIG. 6 is a diagram illustrating an example of rate matching for a polar code in accordance with the present disclosure.

FIG. 6 is a diagram illustrating an example 600 of rate matching for a polar code in accordance with the present disclosure. More particularly, as described herein, the systematic polar encoding shown in FIG. 5 may be used to convert a non-systematic polar code to a systematic form when the information sequence satisfies certain algebraic properties. However, the systematic polar encoding may not work in cases where the information bits are placed at arbitrary locations. Additionally or alternatively, performing the non-systematic encoding twice may not yield a systematic polar code when the block length N is not a power of 2. For example, a mother polar code generally has a coded bit length $N=2^n$, where n is a positive integer, which may differ from a target codeword length E that is needed to achieve a desired rate R=K/E, where K is a quantity of information bits. Accordingly, rate matching for polar codes becomes a length matching problem, where puncturing, shortening, or repetition is performed such that the quantity of transmitted bits equals the target codeword length E. For example, puncturing and shortening both reduce the length of the mother polar code by not transmitting bits in a certain pattern (for example, when E<N), referred to as a puncturing pattern or a shortening pattern, while repetition increases the length of the mother polar code by repeating bits. Accordingly, because the information bits and frozen bits need to be in certain locations in a systematic polar encoding, rate matching may interfere with generating systematic polar codes due to changing the set of information bit locations (for example, some information bits may not be in the codeword when the location of some information bits change in an input domain or an intermediate domain of a systematic polar encoder).

For example, FIG. 6 illustrates an example polar encoding operation and an example polar decoding operation where rate matching is used to generate a set of coded bits that has a given target length $E \neq 2^n$. As shown in FIG. 6, in a first operation 605 at a transmitter, the transmitter obtains a set of A information bits to be transmitted, computes a CRC, and attaches the CRC to the A information bits to obtain a resulting set of $K=A+CRC_{len}$ bits, where $CRC_{len}$ is a length of the CRC attached to the A information bits (for example $CRC_{len}$ may be 24 bits for downlink, or 6 or 11 bits for uplink, depending on the value of K). As further shown, in a second operation 610 at the transmitter, the resulting set of K information bits (including the CRC bits) are input to a polar encoder, which are polar encoded to the mother code block length $N=2^n$. As further shown, in a third operation 615 at the transmitter, a rate matching operation is performed on the N coded bits to generate the set of E coded bits to be transmitted (for example, according to a rate K/E). In a fourth operation 620 at the transmitter, the set of E coded bits are transmitted to a receiver. In a first operation 630 at the receiver, the set of E coded bits are demodulated to output E log likelihood ratio (LLR) values. In a second operation 635 at the receiver, rate recovery is performed, accounting for either puncturing, shortening, or repetition, to obtain N recovered LLR values. In a third operation 640 at the receiver, the N recovered LLR values are polar decoded using an SCL decoder to obtain K decoded bits. In a fourth operation 645 at the receiver, the first $CRC_{len}$ bits of the K decoded bits are removed to recover the A information bits, and the first $CRC_{len}$ bits are compared to the transmitted CRC bits to update BLER and/or BER metrics.

In some cases, when the rate matching operation is performed due to a mother polar code having a coded bit length $N=2^n$ and a quantity of coded bits to be transmitted being $E \neq 2^n$, the rate matching mode may be a puncturing mode or a shortening mode when E<N or a repetition mode when E>N. For example, the puncturing mode and the shortening mode both reduce the length of the mother polar code by not transmitting N−E coded bits in a specific pattern, which may be referred to as a puncturing pattern or a shortening pattern. In the puncturing mode, untransmitted code bits are treated as erased by the decoder, while shortening introduces a subcode imposing the untransmitted code bits to assume a fixed value, typically zero, such that the untransmitted code bits have a value that is already known by the decoder. In the repetition mode, the entire mother polar code is transmitted, and some coded bits are retransmitted. Accordingly, the choice between the puncturing mode, the shortening mode, and the repetition mode generally depends on the length of the polar code (for example, using the repetition mode when E>N or the puncturing or shortening mode when E<N) and a coding rate (for example, with the shortening mode generally providing better performance for polar codes transmitted with high rates, and the puncturing mode providing better performance for low rates).

In some cases, one rate matching technique that may support the puncturing, shortening, and repetition modes is to write the $N=2^n$ bits output from the polar encoder to a length-N circular buffer in an order that is predefined (for example, through a sub-block interleaver) for a given value of N. For example, as shown by reference number 650-1 in FIG. 6, no rate matching is performed when E=N, in which case the transmitter may transmit each bit in the length-N circular buffer. Alternatively, as shown by reference number 650-2, when E<N and the puncturing mode is selected, the puncturing mode may be realized by transmitting E bits from the end of the length-N circular buffer (for example, by selecting and transmitting bits from a starting position N−M to an ending position N−1, such that bits from position 0 to position N−M−1 are untransmitted, where M=E). Alternatively, as shown by reference number 650-3, when E<N and the shortening mode is selected, the shortening mode may be realized by transmitting E bits from the start of the length-N circular buffer (for example, by selecting and transmitting bits from a starting position 0 to an ending position M−1, such that bits from position M to position N−1 are untransmitted, where M=E). Alternatively, as shown by reference number 650-4, when E>N, the repetition mode may be realized by transmitting all bits in the length-N circular buffer, and additionally repeating M-N consecutive bits with a smallest index, where M=E.

As described herein, when rate matching is performed, the information bit locations in the information sequence input to the polar encoder needs to be modified to fit the rate matching pattern. For example, because only the first E bits are transmitted in the shortening mode and only the last E bits are transmitted in the puncturing mode, the information bit locations need to be modified to ensure that there are no information bits in the locations that are untransmitted (and to reserve the shortening or punctured locations for frozen bits). In some cases, bit pre-freezing may be performed to modify the information bit locations to ensure that the information bits only appear in transmitted locations when the rate matching mode is the puncturing mode or the shortening mode. For example, to perform bit pre-freezing, all bits in the input sequence that correspond to untransmitted coded bits may be frozen (for example, all punctured or shortened bit locations may treated as frozen bit locations). In addition, in the puncturing mode, bit pre-freezing may additionally freeze any unfrozen bit with an index u, where $0 \le u < \lceil 3N/4 - M/2 \rceil$ for $M \ge 3N/4$, or $0 \le u < \lceil 9N/16 - M/4 \rceil$ for $M < 3N/4$ (no additional bit freezing is performed for shortening or repetition).

Accordingly, because the information bits and frozen bits need to be in certain locations in a systematic polar encoding, rate matching may interfere with generating systematic polar codes due to the need to change the set of information bit locations according to the rate matching mode. For example, in a systematic polar code, the systematic bits have the same location in the codeword (in the X domain) as the information bits in the input information sequence (in the U domain), provided that the input information sequence satisfies certain algebraic properties, as described in further detail in connection with FIGS. 7A-7B. However, when a rate matching mode is a puncturing mode or a shortening mode (for example, when the rate matching output sequence length, E, is less than the coded bit length of the systematic polar code, N), some of the bits in the systematic polar code are untransmitted. The location of the information bits in the U domain and the Z domain therefore needs to be modified to ensure that the untransmitted bits do not include any systematic bits (for example, some information bits may not be included in the codeword when the location of one or more information bits changes in the U domain or the Z domain).

Accordingly, various aspects described herein relate to techniques to enable rate matching and bit freezing for systematic polar codes. For example, to encode a systematic polar code, an input sequence that includes a set of information bits and a set of frozen bits may be non-systematically encoded into an intermediate sequence, bits at frozen bit locations may be reset to the values of the frozen bits, and the intermediate sequence may be non-systematically again (for example, a systematic polar code can be implemented by calling a non-systematic encoder twice). Furthermore, when the systematic polar code has a coded bit length N that exceeds a target code length E, such that shortening or puncturing is needed to achieve the target code length, locations for shortening or puncturing and for bit freezing may be selected such that a resulting set of information bit locations (including CRC bit locations) in a set A corresponding to a set of indexes associated with the information bits for the systematic polar code satisfy a systematic encoding condition. The systematic encoding condition may mean, for example, that applying two non-systematic polar transforms to information bits that are associated with indexes or locations in the U domain results in the information bits being included in the codeword at the same locations in the Z domain after a first non-systematic polar transform is applied, and the set of information bits are included in a systematic polar code in the X domain after a second non-systematic polar transform is applied. In some aspects, as described herein, the locations for shortening or puncturing and for bit freezing may be selected according to explicit (sufficient) conditions that guarantee that the indexes of the shortening/puncturing locations and bit freezing locations satisfy the systematic encoding condition. Alternatively, when the systematic polar code has a coded bit length N that is shorter than the target code length E, such that repetition is needed to achieve the target code length, the transmitter may prioritize repetition of systematic bits in the codeword over non-systematic bits. For example, when the quantity of bits to be repeated, L, is less than or equal to the quantity of systematic bits, K, the transmitter may repeat the first L systematic bits. Alternatively, when L exceeds K, the transmitter may repeat all K systematic bits plus L-K non-systematic bits, where N+L=E.

In this way, some aspects described herein can enable a low-complexity systematic polar encoding when a systematic polar code has a coded bit length that differs from a target coded bit length, which may enable a better BER than a non-systematic polar code and/or better performance than non-systematic polar codes in use cases where a receiver may have side information or prior knowledge regarding a source of the codeword. In addition, the locations for shortening or puncturing and for bit freezing may be selected according to explicit (sufficient) conditions that guarantee that the indexes of the shortening/puncturing locations and bit freezing locations satisfy a systematic encoding condition, the transmitter that encodes the systematic polar code does not have to verify that the systematic encoding condition is satisfied, which conserves resources and reduces complexity at the transmitter. Additionally, in cases where repetition is performed, prioritizing the repetition of systematic bits over non-systematic bits may provide more protections to the systematic bits of the polar code, which may improve decoding performance.

Figure 7A:
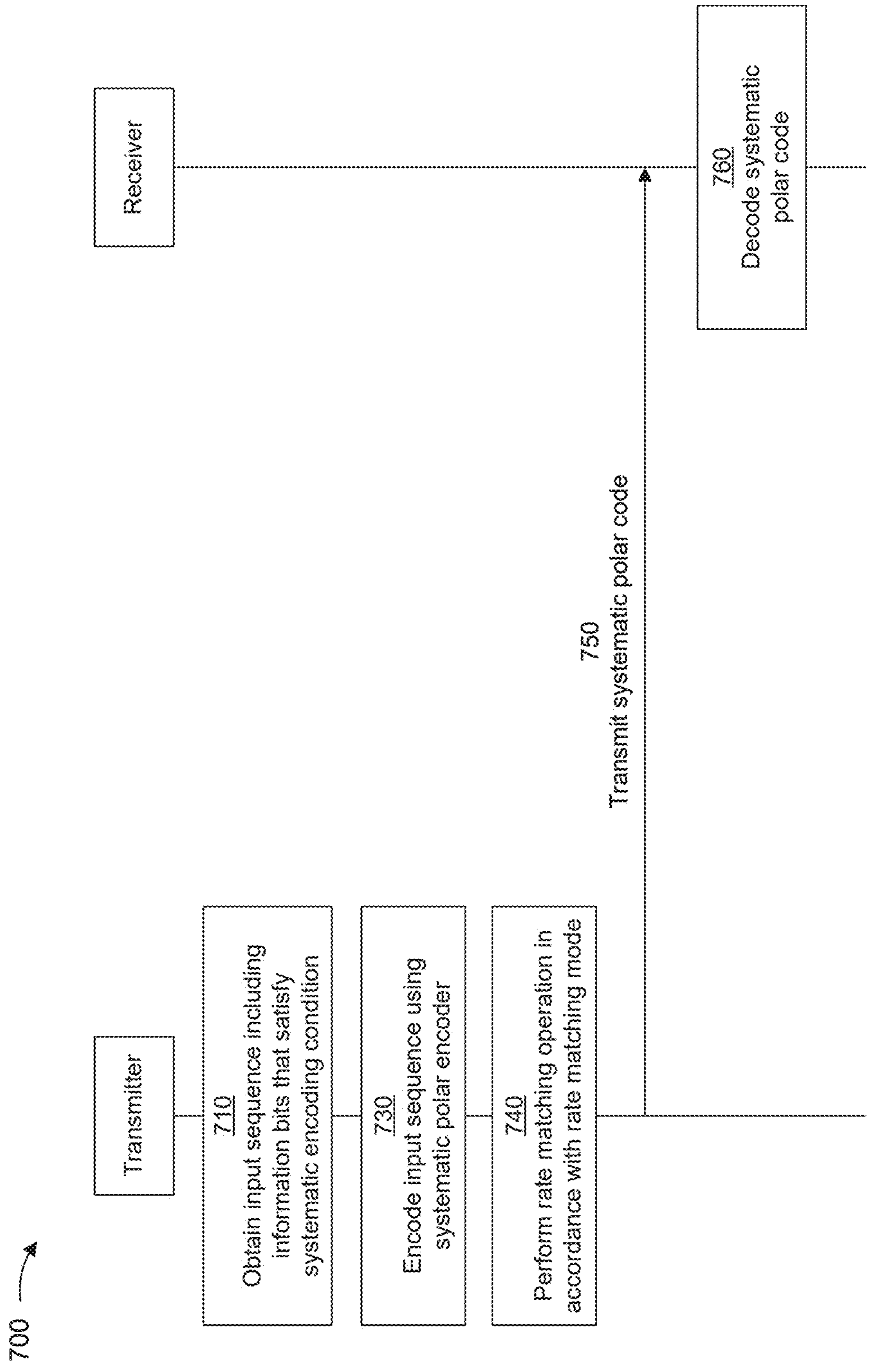
FIGS. 7A-7B are diagrams illustrating an example associated with rate matching and bit freezing for systematic polar codes in accordance with the present disclosure.
Figure 7B:
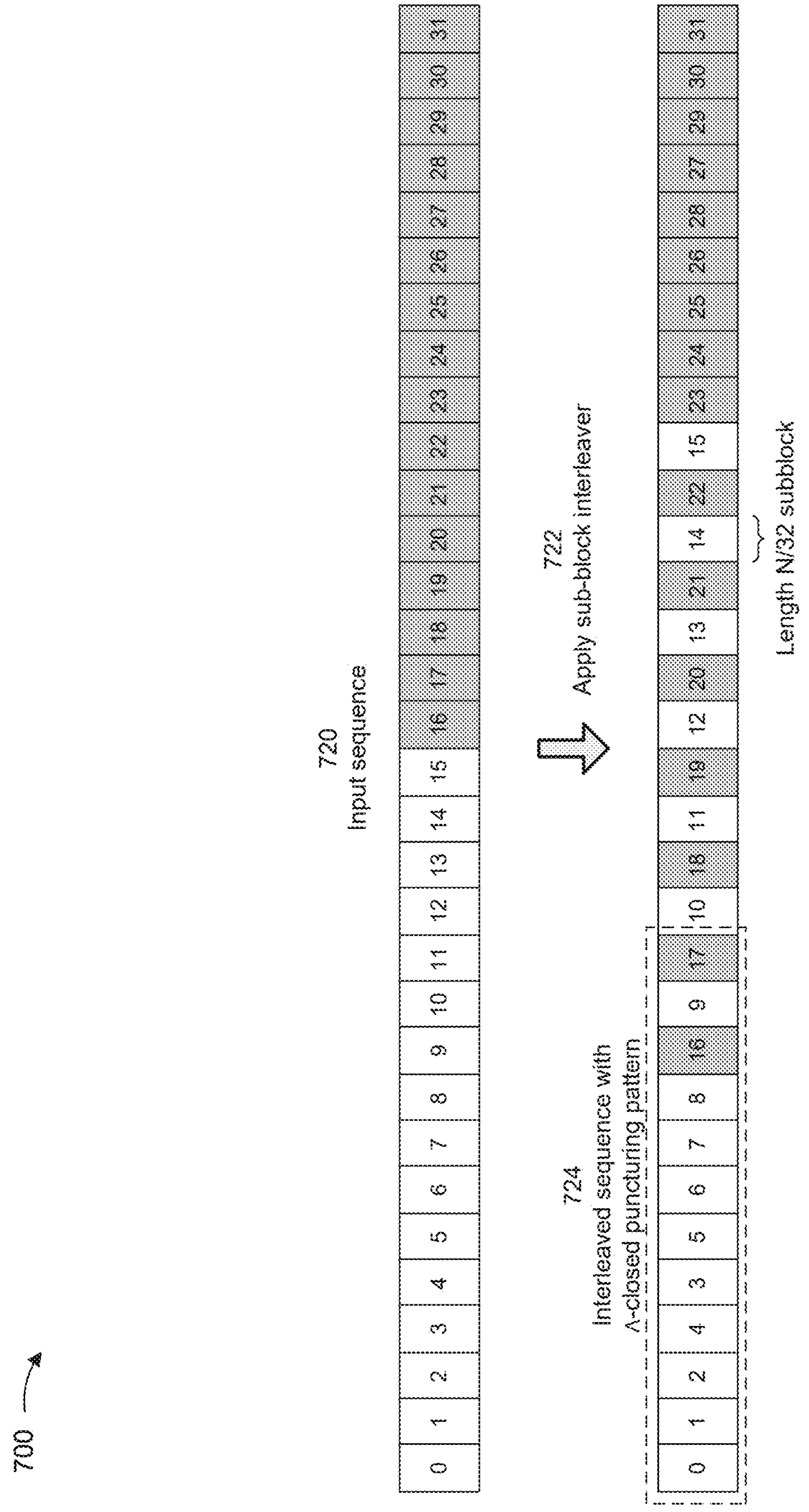

FIGS. 7A-7B are diagrams illustrating an example 700 associated with rate matching and bit freezing for systematic polar codes in accordance with the present disclosure. As shown in FIG. 7A, example 700 includes communication between a transmitter and a receiver. More particularly, as described herein, example 700 relates to a scenario in which the transmitter is configured to encode and transmit, and the receiver is configured to receive and decode, control information that includes a systematic polar code. For example, in some aspects, the transmitter may be a network node 110 configured to encode and transmit one or more DCI messages, one or more broadcast channel (BCH) messages, and/or other suitable messages using a systematic polar code channel coding scheme, and the receiver may be a UE 120 configured to receive and decode the messages that are encoded using the systematic polar code channel coding scheme. Additionally or alternatively, the transmitter may be a UE 120 configured to encode and transmit one or more UCI messages and/or other suitable messages using the systematic polar code channel coding scheme, and the receiver may be a network node 110 configured to receive and decode the messages that are encoded using the systematic polar code channel coding scheme. Additionally or alternatively, the transmitter may be a first UE 120 configured to encode and transmit one or more sidelink control information (SCI) (messages using the systematic polar code channel coding scheme, and the receiver may be a second UE 120 configured to receive and decode the SCI messages that are encoded using the systematic polar code channel coding scheme. Accordingly, although the transmitter and receiver are described in a context where the transmitter encodes and transmits, and the receiver receives and decodes, a systematic polar code, the transmitter may have reception capabilities and receiver may have transmission capabilities.

As shown in FIG. 7A, in a first operation 710, the transmitter may obtain an input sequence that includes a set of information bits (including CRC bits) associated with a set of information bit locations A that satisfies a systematic encoding condition in accordance with a rate matching mode. For example, in cases where the rate matching mode is a shortening mode or a puncturing mode, where the systematic polar code has a coded bit length N that exceeds a target code length E such that one or more bits in the systematic polar code are untransmitted, the transmitter may generally identify a set of locations in the input sequence for shortening or puncturing, and for bit pre-freezing, to ensure that the resulting set of information bit locations A satisfy the systematic encoding condition. Accordingly, when the transmitter changes the input sequence in the U domain such that the set of information bits are at the set of information bit locations A that satisfy the systematic encoding condition, the set of information bits are included in a systematic polar code in an X domain. Alternatively, in cases where the rate matching mode is a repetition mode, where the systematic polar code has a coded bit length N that is less than the target code length E such that the N bits in the systematic polar code are transmitted and E-N bits are retransmitted, the transmitter may map the set of information bits to the set of locations that correspond to the most reliable channels (for example, using typical polar encoding techniques) because the information bits are ensured to appear in the systematic polar code.

For example, in a non-systematic polar encoding, a polar encoder receives an input sequence to be encoded in a U domain, also known as an information bit domain, and applies a polar transform to map the input sequence to a codeword in an X domain, also known as a coded bit domain. However, for a systematic polar encoding, the polar encoder receives an input sequence to be encoded in a U domain, applies a first polar transform to map the input sequence to an intermediate sequence in a Z domain, also known as an intermediate bit domain, and then resets any frozen bits in the non-systematic polar code to 0 or other suitable values before applying the polar transform a second time to map the intermediate sequence to a systematic codeword in the X domain. In that context, some aspects described herein relate to one or more operations that the transmitter may perform in the U domain and the Z domain, to ensure that the applying the two non-systematic polar transforms results in a systematic polar code after rate matching.

More particularly, as described herein, the one or more operations performed in the Z domain may be derived from a mathematical framework associated with a systematic polar encoding and a polarization kernel G in accordance with a lattice structure for a binary cube denoted $$F_2^m,$$

where $F_2$ is a binary field that contains 0s and 1s, and $$F_2^m$$

is an m-dimensional binary field. For example, for any two elements α, β∈

$$F_2^m,$$

the who elements α,β may be interpreted in the mathematical framework as either length-m binary vectors or integers between $[0,2^{m-1}]$. Furthermore, the mathematical framework may define a partial order for the elements in $$F_2^m,$$

where the partial order for elements in $$F_2^m$$

is represented herein using the notation ≼ For example, for any two elements α, β that represent different length-m binary vectors or integers between $[0,2^{m-1}]$, $\alpha \preccurlyeq \beta$ if and only if $\alpha_i \le \beta_i \forall i \in [1, \ldots, m]$, where $\alpha_i$ denotes an $i^{th}$ bit in a binary expansion of α and $\beta_i$ denotes an $i^{th}$ bit in a binary expansion of β (for example, $\alpha \le \beta_i$, for each of the m pairs of positions in α, β). In other words, the partial order for different elements in $$F_2^m$$

is determined according to relative values for each respective pair of bits in α, β, rather than a global order or ranking for all bits in α, β.

Accordingly, as described herein, the partial order of elements in $$F_2^m$$

may be used to define a lattice structure, where $\alpha \wedge \beta$ is a greatest lower bound of α and β with respect to the partial order $\preccurlyeq$ and $\alpha \vee \beta$ is a least upper bound of α and β with respect to the partial order $\preccurlyeq$. For example, as used herein, the notation $\alpha \wedge \beta$ represents the largest vector that is smaller than α and β with respect to the partial order $\preccurlyeq$, and the notation $\alpha \vee \beta$ represents the smallest vector that is larger than α and β with respect to the partial order $\preccurlyeq$. Under this mathematical framework, for any set $A \subset$ $$F_2^m,$$

where the set A is a subset of vectors in the binary cube $$F_2^m,$$

the set A is called v-closed (for example, "or-closed") if $\alpha \vee \beta \in A$ whenever $\alpha \in A$ and $\beta \in$ $$F_2^m.$$

In other words, for each vector α in an $\vee$-closed set A, every vector that is larger than α (with respect to the partial order $\preccurlyeq$) is also included in the set A, which is generally true if the least upper bound of α (for example, the smallest vector larger than α) is included in the set A. Alternatively, the set A is $\wedge$-closed (for example, "and-closed") if $\alpha \wedge \beta \in A$ whenever $\alpha \in A$ and $\beta \in$ $$F_2^m.$$

In other words, for each vector α in an $\wedge$-closed set A, every vector that is smaller than α (with respect to the partial order $\preccurlyeq$) is also included in the set A, which is generally true if the greatest lower bound of α (for example, the largest vector that is smaller than α) is included in the set A. Furthermore, in addition to the partial order described herein, a natural order is defined for all elements in any set A that is a subset of $$F_2^m,$$

where the natural order is defined according to an order of a decimal value corresponding to the binary vectors (for example, 0000<0001<0010< . . . <1101<1110<1111, where 0000 has the decimal value 0, 0001 has the decimal value 1, 0010 has the decimal value 2, and so on). Accordingly, in some aspects, the transmitter may generally identify a set A that is suitable for a puncturing pattern or a shortening pattern in accordance with one or more partial order conditions described herein.

For example, in some aspects, G may denote an N×N polarization kernel (or non-systematic polar transform), where $$G = \begin{bmatrix} 1 & 1 \\ 1 & 0 \end{bmatrix}^{\otimes m},$$

$m = \log_2 N$. For a set $$A \subset F_2^m,$$

where the set A contains indexes in a range from 0 to N−1, the notation $P_A$ represents a projection of a vector $u \in$ $$F_2^m$$

onto A (for example, $P_A{*}u$ represents a subset of bits in the vector u that correspond to locations in the set A). Accordingly, as described herein, the notation $uP_A$ may represent a restriction $u_A$ while retaining an embedding in $$A \subset F_2^m$$

(for example, given a vector u with a particular length, $u_A$ denotes a subset of the vector u that includes elements in the vector u in locations corresponding to the elements in the set A). In that context, the set A denotes a set of indexes that correspond to locations or positions for a set of information bits for a polar code in a U domain. For example, in the input sequence shown in FIG. 5, which includes indexes from 0 to 7, the set A would include indexes {1, 3, 5, 6, 7}, which correspond to the locations of information bits $\{\alpha_0, \ldots \alpha_4\}$. In some aspects, as described herein, the systematic encoding condition may be satisfied for a given rate matching mode (for example, the information bits are associated with indexes or locations in the U domain and the Z domain that result in the information bits being included in the codeword at the same locations) when $(GP_A)^2 = P_A$. For example, in the systematic polar encoding, the projection $P_A$ is applied to the input vector u in the U domain such that the polar transform G is first applied only to $u_A$, which is the subset of the input vector u at the information bit locations. The projection $P_A$ is then applied again in the Z domain, resetting (frozen bit)

locations that are not in the set A to 0s, and the polar transform G is applied a second time to produce a sequence of encoded bits in the X domain with systematic bits at the same locations as the information bits in the U domain. Furthermore, the systematic bits do not appear in any untransmitted (for example, punctured or shortened) locations.

Accordingly, in the first operation 710, the transmitter may generally select a set of information bit locations A that satisfies the systematic encoding condition $(GP_A)^2=P_A$. For example, when a rate matching mode is a shortening mode or a puncturing mode, the transmitter may identify a set of locations (or indexes) for shortening or puncturing and for bit pre-freezing such that a resulting set of information bit locations (including CRC bit locations) A satisfies the systematic encoding condition $(GP_A)^2=P_A$. For example, as described herein, the locations or indexes of the shortening, puncturing, and/or bit pre-freezing locations may be defined according to explicit (sufficient) rules that satisfy the systematic encoding condition, whereby the transmitter does not need to perform any computations to verify that the systematic encoding condition is satisfied.

In particular, to obtain the input sequence with the information bits at a set of locations A that satisfies the systematic encoding condition, the transmitter may determine a rate matching mode, and may determine the set of locations A for the set of information bits in accordance with the rate matching mode. For example, the transmitter may determine a coded bit length N for a systematic polar code associated with the input sequence, and may determine a target bit length E that may differ from the coded bit length N (note that rate matching is not needed when E=N). For example, in cases where E<N, the rate matching mode may be a puncturing mode when a rate K/E fails to satisfy (for example, is less than or equal to) a threshold, or a shortening mode when the rate K/E satisfies (for example, exceeds) the threshold. Alternatively, the rate matching mode may be a repetition mode in cases where E>N.

In some aspects, when the rate matching mode is the puncturing mode, the transmitter may select a set of punctured locations associated with a set of punctured indexes that is $\wedge$-closed. For example, as described herein, a set of punctured indexes (or puncturing pattern) is $\wedge$-closed if, for each respective index in the set of punctured indexes, every element of the m-dimensional binary field $$F_2^m$$

that is smaller than the respective index with respect to the partial order $\preccurlyeq$ in $$F_2^m$$

is also included in the set of punctured indexes, where m is a positive integer. In other words, if a bit mapped to or otherwise associated with an index $\alpha$ in the polar code input sequence is punctured, then bits in all indexes that are smaller than the index $\alpha$ with respect to the partial order $\preccurlyeq$ are also punctured. For example, one $\wedge$-closed puncturing pattern may include a block puncture pattern, where the first L bits or indexes are punctured according to a natural order on $$F_2^m$$

(for example, the set of punctured locations is associated with indexes {0, 1, 2, . . . . L−1}). In another example, an $\wedge$-closed puncturing pattern may include a sub-block puncture pattern, where the set of punctured locations is associated with indexes {J(n), n=0, . . . . L}, where J(n) is a sub-block interleaver and P(i) is a sub-block interleaver pattern (for example, as defined in TS 38.212). In particular, a sub-block puncture pattern is $\wedge$-closed when the set of punctured indexes contains the first L indexes after the sub-block interleaver is applied. For example, FIG. 7B illustrates an example input sequence 720 where the total quantity of bits is partitioned into 32 groups or sub-blocks, and a sub-block interleaver 722 is then applied to interleave (for example, rearrange) the 32 groups or sub-blocks to produce an interleaved sequence with an $\wedge$-closed puncturing pattern. For example, the input sequence 720 (input to the sub-block interleaver 722) may include a set of coded bits $d_0, d_1, d_2, \ldots, d_{N-1}$, which are divided into 32 sub-blocks, and the output from the sub-block interleaver 722 are denoted $y_0, y_1, y_2, \ldots, y_{N-1}$, which are generated by setting $$i=\lfloor 32n/N \rfloor \text{ and } J(n)=P(i)\times\left(\frac{N}{32}\right)+\bmod\,(n,\,N/32)$$

such that $y_n=d_{J(n)}$ for n=0 to N−1. Accordingly, FIG. 7B illustrates an example where an interleaved sequence 724 includes an $\wedge$-closed set of punctured indexes, which contains the first L indexes after the sub-block interleaver is applied, for L=12. In this way, any sub-block interleaver pattern P(i) that preserves the partial order $\preccurlyeq$ results in a sub-block pattern J(n) associated with an $\wedge$-closed puncturing pattern. Accordingly, when the rate matching mode is the puncturing mode, the transmitter may select the set of $\wedge$-closed set of punctured locations, which correspond to untransmitted bits, and such that a set of locations A for the set of information bits do not include any of the locations in the set of punctured locations.

Alternatively, when the rate matching mode is the shortening mode, the transmitter may select a set of shortened locations associated with a set of shortened indexes that is $\vee$-closed. For example, as described herein, a set of shortened indexes (or shortening pattern) is $\vee$-closed if, for each respective index in the set of shortened indexes, every element of the m-dimensional binary field $$F_2^m$$

that is larger than the respective index with respect to the partial order $\preccurlyeq$ in $$F_2^m,$$

is also included in the set of shortened indexes. In other words, if a bit mapped to or otherwise associated with an index α in the polar code input sequence is shortened, then bits in all indexes that are larger than the index a with respect to the partial order ≼ are also shortened. For example, in some aspects, any set A is ⋁-closed if and only if the set $\overline{A}$ is ⋀-closed, where the set $\overline{A}$ is a complement of the set A. For example, one ⋁-closed shortening pattern may include a block shortening pattern, where the set of shortened bit locations is associated with the last L indexes with respect to the natural order $$F_2^m$$

(for example, the set of shortened locations is associated with indexes {N−L, . . . . N−1}). In another example, an ⋁-closed puncturing pattern may include a sub-block shortening pattern, where the set of shortened locations is associated with indexes {J(i), i=N−L, . . . . N−1}, where J denotes the sub-block interleaver 722 in FIG. 7B. In particular, a sub-block shortening pattern is ⋁-closed when the last L indexes after the sub-block interleaver is applied is ⋁-closed. Accordingly, when the rate matching mode is the shortening mode, the transmitter may select the set of ⋁-closed set of punctured locations, which correspond to untransmitted bits, and such that a set of locations A for the set of information bits do not include any of the shortened locations.

In some aspects, when the rate matching mode is the puncturing or the shortening mode, the transmitter may additionally select a set of bit freezing locations associated with a set of bit freezing indexes that is ⋀-closed. For example, as described herein, the set of bit freezing locations is ⋀-closed if, for each respective index in the set of bit freezing indexes, every element of the m-dimensional binary field $$F_2^m$$

that is smaller than the respective index with respect to the partial order ≼ in $$F_2^m$$

is also included in the set of bit freezing indexes. In other words, if a bit mapped to or otherwise associated with an index α in the polar code input sequence is frozen, then bits in all indexes that are smaller than the index α with respect to the partial order ≼ are also frozen. For example, one ⋀-closed bit freezing pattern may include the first L indexes according to a natural order on $$F_2^m$$

(for example, the set of bit freezing locations is associated with indexes {0, 1, 2, . . . . L−1}). In another example, an ⋀-closed puncturing pattern may include any suitable sub-block pattern associated with sub-block interleaver pattern that preserves the partial order ≼. In this way, the transmitter may select an ⋀-closed set of bit freezing locations, which may correspond to a set of indexes that are preselected as frozen bit locations, regardless of the polar reliability sequence.

Accordingly, in a second operation 730, the transmitter may encode the input sequence using a systematic polar encoder, where the input sequence includes a set of information bits at a set of locations that satisfies a systematic encoding condition in accordance with a rate matching mode. For example, in some aspects, the input sequence may include a set of frozen bits at an ⋀-closed set of bit freezing locations, where the set of information bits are associated with a set of information bit locations that are not included among the set of bit freezing locations. Furthermore, in cases where the rate matching mode is the puncturing mode or the shortening mode, the input sequence may include a set of punctured locations associated with an ⋀-closed set of punctured indexes or a set of shortened locations associated with an ⋁-closed set of shortened indexes. In this way, a resulting set of locations for the information bits (for example, excluding the frozen bit locations and the punctured/shortened locations) may satisfy the systematic encoding condition. For example, referring to FIG. 5, after the first polar transform is applied to the polar code input sequence in the U domain 510, bits associated with indexes that are punctured, shortened, and/or pre-frozen in the U domain 510 are set to zero in the Z domain 520. Furthermore, when the rate matching mode is the repetition mode, such that all coded bits are transmitted, the resulting set of locations for the information bits (for example, excluding the frozen bit locations) may satisfy the systematic encoding condition. The transmitter may then encode the input sequence using the systematic polar encoder, as described above. For example, the systematic polar encoder may first apply the projection $P_A$ to the input sequence in the U domain such that the polar transform G is first applied only to the information bits. The projection $P_A$ is then applied again in the Z domain, resetting the frozen bit locations to 0s, and the polar transform G is applied a second time to produce a set of coded bits in the X domain, where the coded bits include systematic bits at the same locations as the information bits in the U domain.

As further shown in FIG. 7A, in a third operation 740, the transmitter may perform a rate matching operation in accordance with the rate matching mode. For example, when the coded bit length N output from the systematic polar encoder exceeds the target bit length E and the target rate K/E (where K is a quantity of information bits in the U domain or a quantity of systematic bits in the Z domain) is less than or equal to a threshold, the rate matching mode is a puncturing mode and the transmitter may select bits associated with indexes from N−M to N−1 for transmission, such that bits associated with indexes from 0 to N−M−1 are untransmitted, where M is an integer having a smaller value than N (for example, M=E). Alternatively, when the coded bit length N output from the systematic polar encoder exceeds the target bit length E and the target rate K/E exceeds the threshold, the rate matching mode is the shortening mode and the transmitter may select bits associated with indexes from 0 to M−1 for transmission, such that bits associated with indexes from M to N−1 are untransmitted. Alternatively, when the coded bit length N output from the systematic polar encoder is less than the target bit length E, the rate matching mode is the repetition mode, in which case the transmitter may select all bits associated with indexes from 0 to N−1 for transmission, and may select an additional L bits to be repeated. In some aspects, when selecting the additional L bits to be repeated, the transmitter may generally prioritize repetition of systematic bits over non-systematic bits. For example, where the quantity of coded bits to be transmitted is E=N+L and the N coded bits include K systematic bits, the transmitter may select the first L systematic bits for repetition if L≤K. Alternatively, if N≥L>K, the transmitter may select all K systematic bits for repetition, plus L-K non-systematic bits. In this way, the repetition mode may prioritize the systematic bits of the polar code, which improves decoding performance. Furthermore, in the systematic polar code, the K systematic bits are at the same location as the information bits input to the systematic polar encoder and the systematic bits do not appear in any untransmitted locations (for example, punctured or shortened locations when the rate matching mode is a puncturing or shortening mode).

As further shown in FIG. 7A, in a fourth operation 750, the transmitter may transmit the systematic polar code to the receiver in accordance with the rate matching mode. For example, as described herein, the transmitter may transmit E bits that are selected for transmission in accordance with the puncturing mode, the shortening mode, or the repetition mode (for example, depending on the coding rate and the value of N). In a fifth operation 760, the receiver may then decode the systematic polar code. For example, as described herein, the receiver first decodes the systematic polar code in the X domain using a conventional decoder (for example, an SCL decoder) to obtain the intermediate bits in the Z domain (for example, according to the known locations of the frozen bits), and may then use similar techniques to convert the intermediate bits to the U domain to obtain the information bits using the polar transform.

Figure 8:
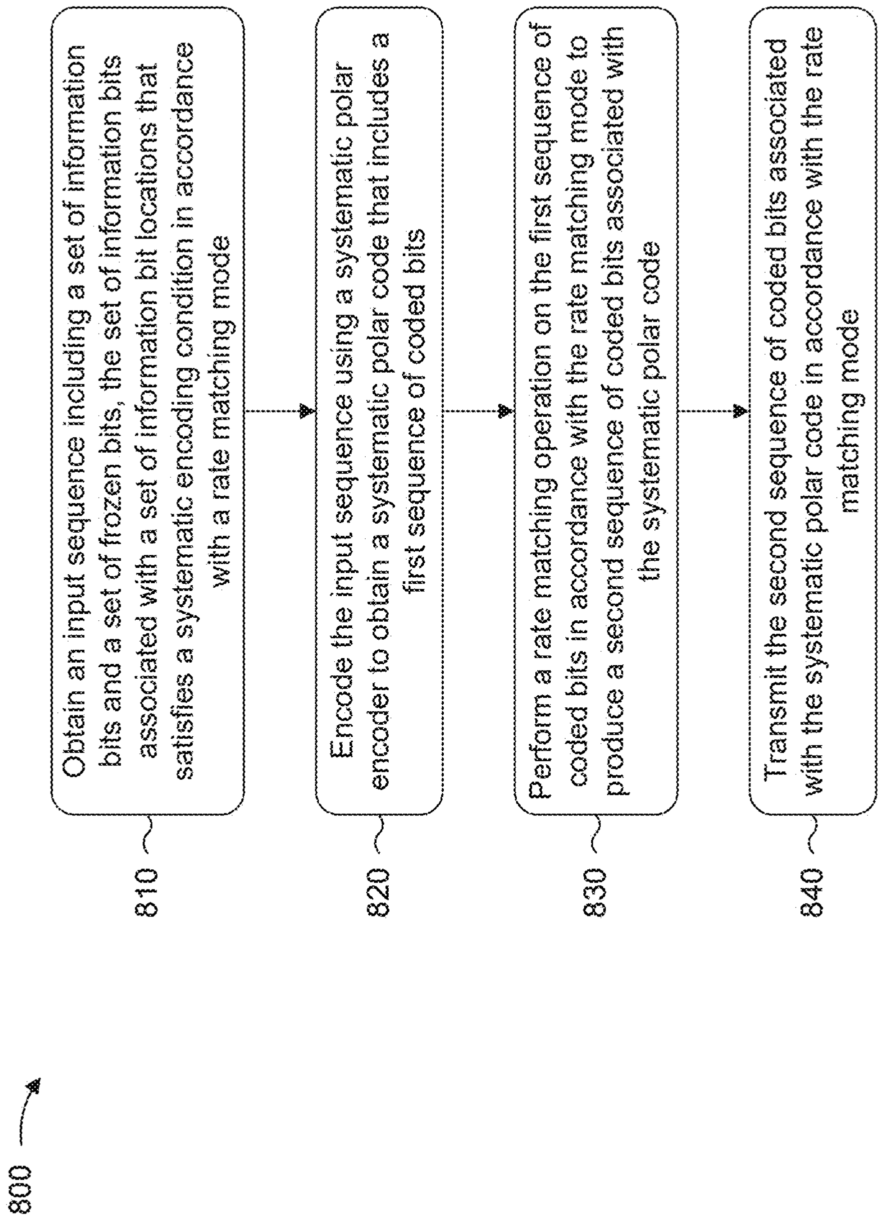
FIG. 8 is a flowchart illustrating an example process performed, for example, by a transmitter in accordance with the present disclosure.

FIG. 8 is a flowchart illustrating an example process 800 performed, for example, at a transmitter or an apparatus of a transmitter that supports polar encoding in accordance with the present disclosure. Example process 800 is an example where the apparatus or the transmitter (for example, UE 120 and/or network node 110) performs operations associated with rate matching and bit freezing for systematic polar codes.

As shown in FIG. 8, in some aspects, process 800 may include obtaining an input sequence including a set of information bits and a set of frozen bits, the set of information bits associated with a set of information bit locations that satisfies a systematic encoding condition in accordance with a rate matching mode (block 810). For example, the transmitter (such as by using communication manager 906 or systematic polar encoding component 908, depicted in FIG. 9) may obtain an input sequence including a set of information bits and a set of frozen bits, the set of information bits associated with a set of information bit locations that satisfies a systematic encoding condition in accordance with a rate matching mode, as described above.

As further shown in FIG. 8, in some aspects, process 800 may include encoding the input sequence using a systematic polar encoder to obtain a systematic polar code that includes a first sequence of coded bits (block 820). For example, the transmitter (such as by using communication manager 906 or systematic polar encoding component 908, depicted in FIG. 9) may encode the input sequence using a systematic polar encoder to obtain a systematic polar code that includes a first sequence of coded bits, as described above.

As further shown in FIG. 8, in some aspects, process 800 may include performing a rate matching operation on the first sequence of coded bits in accordance with the rate matching mode to produce a second sequence of coded bits associated with the systematic polar code (block 830). For example, the transmitter (such as by using communication manager 906 or rate matching component 910, depicted in FIG. 9) may perform a rate matching operation on the first sequence of coded bits in accordance with the rate matching mode to produce a second sequence of coded bits associated with the systematic polar code, as described above.

As further shown in FIG. 8, in some aspects, process 800 may include transmitting the second sequence of coded bits associated with the systematic polar code in accordance with the rate matching mode (block 840). For example, the transmitter (such as by using communication manager 906 or transmission component 904, depicted in FIG. 9) may transmit the second sequence of coded bits associated with the systematic polar code in accordance with the rate matching mode, as described above.

Process 800 may include additional aspects, such as any single aspect or any combination of aspects described below or in connection with one or more other processes described elsewhere herein.

In a first additional aspect, the rate matching mode is a puncturing mode in which the second sequence of coded bits are associated with indexes from N−M to N−1, such that bits associated with indexes from 0 to N−M−1 are untransmitted, where N is a length of the first sequence of coded bits and M is an integer having a smaller value than N.

In a second additional aspect, alone or in combination with the first aspect, the systematic polar code includes a set of punctured locations that satisfies the systematic encoding condition in accordance with the rate matching mode being the puncturing mode.

In a third additional aspect, alone or in combination with one or more of the first and second aspects, the set of punctured locations is associated with a set of punctured indexes that includes, for each respective element $\alpha$ in the set of punctured indexes, every element of an m-dimensional binary field that is smaller than a with respect to a partial order of elements in the m-dimensional binary field, where m is a positive integer.

In a fourth additional aspect, alone or in combination with one or more of the first through third aspects, the rate matching mode is a shortening mode in which the second sequence of coded bits are associated with indexes from 0 to M−1, such that bits associated with indexes from M to N−1 are untransmitted, where N is a length of the first sequence of coded bits and M is an integer having a smaller value than N.

In a fifth additional aspect, alone or in combination with one or more of the first through fourth aspects, the systematic polar code includes a set of shortened locations that satisfies the systematic encoding condition in accordance with the rate matching mode being the shortening mode.

In a sixth additional aspect, alone or in combination with one or more of the first through fifth aspects, the set of shortened locations is associated with a set of shortened indexes that includes, for each respective element $\alpha$ in the set of shortened indexes, every element of an m-dimensional binary field that is larger than a with respect to a partial order of elements in the m-dimensional binary field, where m is a positive integer.

In a seventh additional aspect, alone or in combination with one or more of the first through sixth aspects, the set of frozen bits is associated with a set of bit freezing locations that satisfies the systematic encoding condition.

In an eighth additional aspect, alone or in combination with one or more of the first through seventh aspects, the set of bit freezing locations is associated with a set of freezing indexes that includes, for each respective element $\alpha$ in the set of freezing indexes, every element of an m-dimensional binary field that is smaller than a with respect to a partial order of elements in the m-dimensional binary field, where m is a positive integer.

In a ninth additional aspect, alone or in combination with one or more of the first through eighth aspects, the rate matching mode is a repetition mode in which the second sequence of coded bits includes the first sequence of coded bits and a repetition of L coded bits in the first sequence of coded bits, where N is a length of the first sequence of coded bits and L is an integer having a smaller value than N.

In a tenth additional aspect, alone or in combination with one or more of the first through ninth aspects, the first sequence of coded bits associated with the systematic polar code includes K systematic bits and N−K non-systematic bits, and the repetition mode prioritizes repetition of the systematic bits over the non-systematic bits.

In an eleventh additional aspect, alone or in combination with one or more of the first through tenth aspects, the L coded bits include an initial L systematic bits associated with lowest indexes in accordance with K being greater than L.

In a twelfth additional aspect, alone or in combination with one or more of the first through eleventh aspects, the L coded bits include the K systematic bits and L-K non-systematic bits in accordance with L being greater than K.

In a thirteenth additional aspect, alone or in combination with one or more of the first through twelfth aspects, the first sequence of coded bits has a length N and the second sequence of coded bits has a length E, where N and E are integers that have different values.

In a fourteenth additional aspect, alone or in combination with one or more of the first through thirteenth aspects, encoding the input sequence using the systematic polar encoder comprises performing a first non-systematic encoding on the input sequence to obtain a non-systematic polar code, resetting a set of bits in the non-systematic polar code at positions corresponding to the set of frozen bits to a value associated with the set of frozen bits, and performing a second non-systematic encoding on the set of bits in the non-systematic polar code to obtain the systematic polar code.

Although FIG. 8 shows example blocks of process 800, in some aspects, process 800 may include additional blocks, fewer blocks, different blocks, or differently arranged blocks than those depicted in FIG. 8. Additionally or alternatively, two or more of the blocks of process 800 may be performed in parallel.

Figure 9:
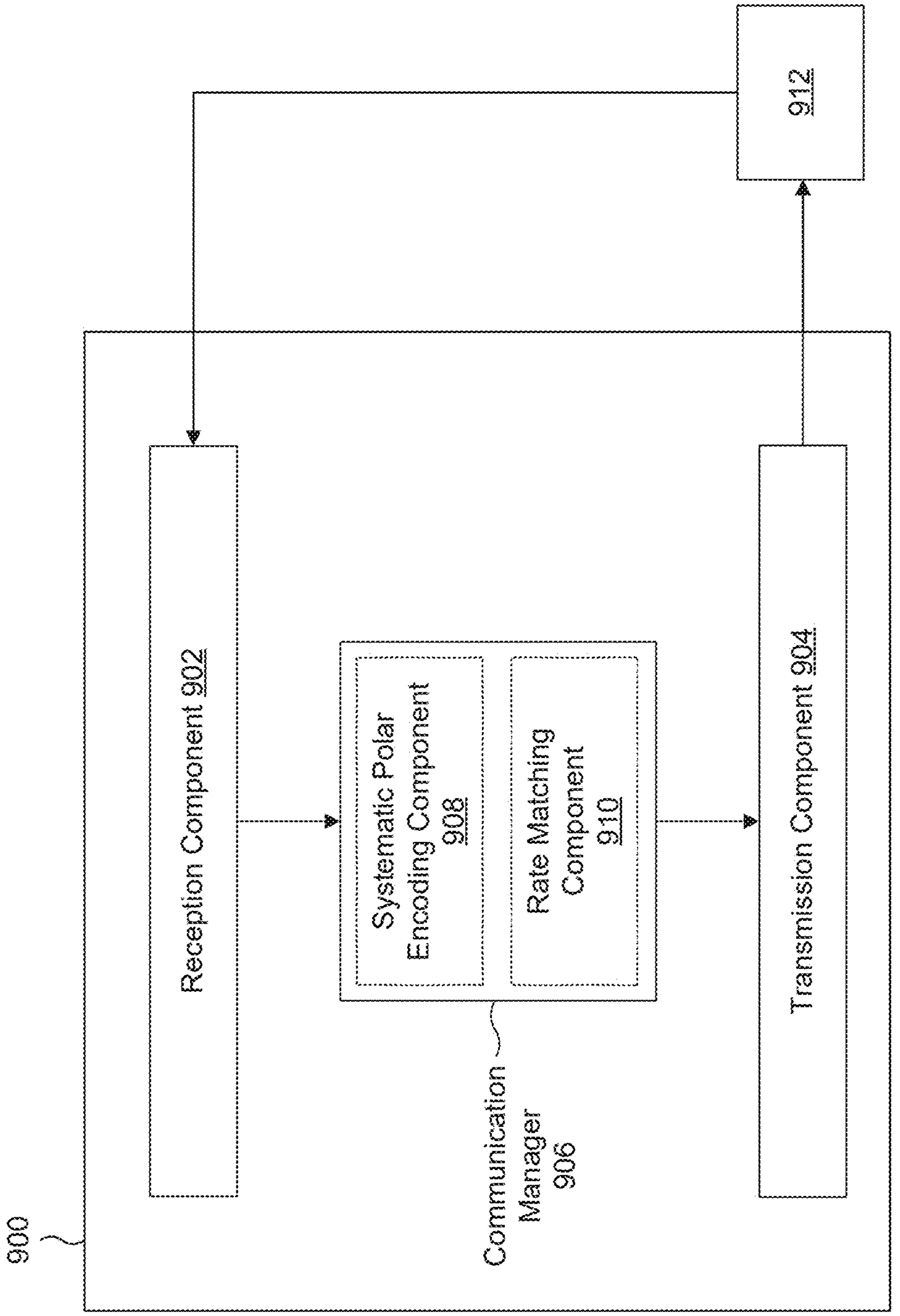
FIG. 9 is a diagram of an example apparatus for wireless communication in accordance with the present disclosure.

FIG. 9 is a diagram of an example apparatus 900 for wireless communication that supports polar encoding in accordance with the present disclosure. The apparatus 900 may be a transmitter, or a transmitter may include the apparatus 900. In some aspects, the apparatus 900 includes a reception component 902, a transmission component 904, and a communication manager 906, which may be in communication with one another (for example, via one or more buses). As shown, the apparatus 900 may communicate with another apparatus 912 (such as a UE, a network node, or another wireless communication device) using the reception component 902 and the transmission component 904.

In some aspects, the apparatus 900 may be configured to and/or operable to perform one or more operations described herein in connection with FIG. 5, FIG. 6, and/or FIGS. 7A-7B. Additionally or alternatively, the apparatus 900 may be configured to and/or operable to perform one or more processes described herein, such as process 800 of FIG. 8. In some aspects, the apparatus 900 may include one or more components of the UE 120 and/or the network node 110 described above in connection with FIG. 1 and FIG. 2.

The reception component 902 may receive communications, such as reference signals, control information, and/or data communications, from the apparatus 912. The reception component 902 may provide received communications to one or more other components of the apparatus 900, such as the communication manager 906. In some aspects, the reception component 902 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components. In some aspects, the reception component 902 may include one or more antennas, one or more modems, one or more demodulators, one or more MIMO detectors, one or more receive processors, one or more controllers/processors, and/or one or more memories of the transmitter described above in connection with FIG. 1 and FIG. 2.

The transmission component 904 may transmit communications, such as reference signals, control information, and/or data communications, to the apparatus 912. In some aspects, the communication manager 906 may generate communications and may transmit the generated communications to the transmission component 904 for transmission to the apparatus 912. In some aspects, the transmission component 904 may perform signal processing on the generated communications (such as filtering, amplification, modulation, digital-to-analog conversion, multiplexing, interleaving, mapping, or encoding, among other examples), and may transmit the processed signals to the apparatus 912. In some aspects, the transmission component 904 may include one or more antennas, one or more modems, one or more modulators, one or more transmit MIMO processors, one or more transmit processors, one or more controllers/processors, and/or one or more memories of the transmitter described above in connection with FIG. 1 and FIG. 2. In some aspects, the transmission component 904 may be co-located with the reception component 902 in one or more transceivers.

The communication manager 906 may obtain an input sequence including a set of information bits and a set of frozen bits, the set of information bits associated with a set of information bit locations that satisfies a systematic encoding condition in accordance with a rate matching mode. The communication manager 906 may encode the input sequence using a systematic polar encoder to obtain a systematic polar code that includes a first sequence of coded bits. The communication manager 906 may perform a rate matching operation on the first sequence of coded bits in accordance with the rate matching mode to produce a second sequence of coded bits associated with the systematic polar code. The communication manager 906 may transmit or may cause the transmission component 904 to transmit the second sequence of coded bits associated with the systematic polar code in accordance with the rate matching mode. In some aspects, the communication manager 906 may perform one or more operations described elsewhere herein as being performed by one or more components of the communication manager 906.

The communication manager 906 may include one or more controllers/processors, one or more memories, one or more schedulers, and/or one or more communication units of the UE 120 and/or the network node 110 described above in connection with FIG. 1 and FIG. 2. In some aspects, the communication manager 906 includes a set of components, such as a systematic polar encoding component 908 and/or a rate matching component 910. Alternatively, the set of components may be separate and distinct from the communication manager 906. In some aspects, one or more components of the set of components may include or may be implemented within one or more controllers/processors, one or more memories, one or more schedulers, and/or one or more communication units of the transmitter described above in connection with FIG. 1 and FIG. 2. Additionally or alternatively, one or more components of the set of components may be implemented at least in part as software stored in one or more memories. For example, a component (or a portion of a component) may be implemented as instructions or code stored in a non-transitory computer-readable medium and executable by one or more controllers or one or more processors to perform the functions or operations of the component.

The systematic polar encoding component 908 may obtain an input sequence including a set of information bits and a set of frozen bits, the set of information bits associated with a set of information bit locations that satisfies a systematic encoding condition in accordance with a rate matching mode. The systematic polar encoding component 908 may encode the input sequence using a systematic polar encoder to obtain a systematic polar code that includes a first sequence of coded bits. The rate matching component 910 may perform a rate matching operation on the first sequence of coded bits in accordance with the rate matching mode to produce a second sequence of coded bits associated with the systematic polar code. The transmission component 904 may transmit the second sequence of coded bits associated with the systematic polar code in accordance with the rate matching mode.

The quantity and arrangement of components shown in FIG. 9 are provided as an example. In practice, there may be additional components, fewer components, different components, or differently arranged components than those shown in FIG. 9. Furthermore, two or more components shown in FIG. 9 may be implemented within a single component, or a single component shown in FIG. 9 may be implemented as multiple, distributed components. Additionally or alternatively, a set of (one or more) components shown in FIG. 9 may perform one or more functions described as being performed by another set of components shown in FIG. 9.

The following provides an overview of some Aspects of the present disclosure:

Aspect 1: A method for wireless communication by a transmitter, comprising: obtaining an input sequence including a set of information bits and a set of frozen bits, the set of information bits associated with a set of information bit locations that satisfies a systematic encoding condition in accordance with a rate matching mode; encoding the input sequence using a systematic polar encoder to obtain a systematic polar code that includes a first sequence of coded bits; performing a rate matching operation on the first sequence of coded bits in accordance with the rate matching mode to produce a second sequence of coded bits associated with the systematic polar code; and transmitting the second sequence of coded bits associated with the systematic polar code in accordance with the rate matching mode.

Aspect 2: The method of Aspect 1, wherein the rate matching mode is a puncturing mode in which the second sequence of coded bits are associated with indexes from N−M to N−1, such that bits associated with indexes from 0 to N−M−1 are untransmitted, where Nis a length of the first sequence of coded bits and M is an integer having a smaller value than N.

Aspect 3: The method of Aspect 2, wherein the systematic polar code includes a set of punctured locations that satisfies the systematic encoding condition in accordance with the rate matching mode being the puncturing mode.

Aspect 4: The method of Aspect 3, wherein the set of punctured locations is associated with a set of punctured indexes that includes, for each respective element α in the set of punctured indexes, every element of an m-dimensional binary field that is smaller than a with respect to a partial order of elements in the m-dimensional binary field, where m is a positive integer.

Aspect 5: The method of Aspect 1, wherein the rate matching mode is a shortening mode in which the second sequence of coded bits are associated with indexes from 0 to M−1, such that bits associated with indexes from M to N−1 are untransmitted, where N is a length of the first sequence of coded bits and M is an integer having a smaller value than N.

Aspect 6: The method of Aspect 5, wherein the systematic polar code includes a set of shortened locations that satisfies the systematic encoding condition in accordance with the rate matching mode being the shortening mode.

Aspect 7: The method of Aspect 6, wherein the set of shortened locations is associated with a set of shortened indexes that includes, for each respective element α in the set of shortened indexes, every element of an m-dimensional binary field that is larger than a with respect to a partial order of elements in the m-dimensional binary field, where m is a positive integer.

Aspect 8: The method of any of Aspects 1-7, wherein the set of frozen bits is associated with a set of bit freezing locations that satisfies the systematic encoding condition.

Aspect 9: The method of Aspect 8, wherein the set of bit freezing locations is associated with a set of freezing indexes that includes, for each respective element α in the set of freezing indexes, every element of an m-dimensional binary field that is smaller than a with respect to a partial order of elements in the m-dimensional binary field, where m is a positive integer.

Aspect 10: The method of any of Aspects 1 or 8-9, wherein the rate matching mode is a repetition mode in which the second sequence of coded bits includes the first sequence of coded bits and a repetition of L coded bits in the first sequence of coded bits, where N is a length of the first sequence of coded bits and L is an integer having a smaller value than N.

Aspect 11: The method of Aspect 10, wherein the first sequence of coded bits associated with the systematic polar code includes K systematic bits and N−K non-systematic bits, and wherein the repetition mode prioritizes repetition of the systematic bits over the non-systematic bits.

Aspect 12: The method of Aspect 11, wherein the L coded bits include an initial L systematic bits associated with lowest indexes in accordance with K being greater than L.

Aspect 13: The method of Aspect 11, wherein the L coded bits include the K systematic bits and L-K non-systematic bits in accordance with L being greater than K.

Aspect 14: The method of any of Aspects 1-13, wherein the first sequence of coded bits has a length N and the second sequence of coded bits has a length E, where N and E are integers that have different values.

Aspect 15: The method of any of Aspects 1-14, wherein encoding the input sequence using the systematic polar encoder comprises: performing a first non-systematic encoding on the input sequence to obtain a non-systematic polar code; resetting a set of bits in the non-systematic polar code at positions corresponding to the set of frozen bits to a value associated with the set of frozen bits; and performing a second non-systematic encoding on the set of bits in the non-systematic polar code to obtain the systematic polar code.

Aspect 16: An apparatus for wireless communication at a device, the apparatus comprising one or more processors; one or more memories coupled with the one or more processors; and instructions stored in the one or more memories and executable by the one or more processors to cause the apparatus to perform the method of one or more of Aspects 1-15.

Aspect 17: An apparatus for wireless communication at a device, the apparatus comprising one or more memories and one or more processors coupled to the one or more memories, the one or more processors configured to cause the device to perform the method of one or more of Aspects 1-15.

Aspect 18: An apparatus for wireless communication, the apparatus comprising at least one means for performing the method of one or more of Aspects 1-15.

Aspect 19: A non-transitory computer-readable medium storing code for wireless communication, the code comprising instructions executable by one or more processors to perform the method of one or more of Aspects 1-15.

Aspect 20: A non-transitory computer-readable medium storing a set of instructions for wireless communication, the set of instructions comprising one or more instructions that, when executed by one or more processors of a device, cause the device to perform the method of one or more of Aspects 1-15.

Aspect 21: A device for wireless communication, the device comprising a processing system that includes one or more processors and one or more memories coupled with the one or more processors, the processing system configured to cause the device to perform the method of one or more of Aspects 1-15.

Aspect 22: An apparatus for wireless communication at a device, the apparatus comprising one or more memories and one or more processors coupled to the one or more memories, the one or more processors individually or collectively configured to cause the device to perform the method of one or more of Aspects 1-15.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware or a combination of hardware and at least one of software or firmware. "Software" shall be construed broadly to mean instructions, instruction sets, code, code segments, program code, programs, subprograms, software modules, applications, software applications, software packages, routines, subroutines, objects, executables, threads of execution, procedures, or functions, among other examples, whether referred to as software, firmware, middleware, microcode, hardware description language, or otherwise. As used herein, a "processor" is implemented in hardware or a combination of hardware and software. It will be apparent that systems or methods described herein may be implemented in different forms of hardware or a combination of hardware and software. The actual specialized control hardware or software code used to implement these systems or methods is not limiting of the aspects. Thus, the operation and behavior of the systems or methods are described herein without reference to specific software code, because those skilled in the art will understand that software and hardware can be designed to implement the systems or methods based, at least in part, on the description herein. A component being configured to perform a function means that the component has a capability to perform the function, and does not require the function to be actually performed by the component, unless noted otherwise.

As used herein, "satisfying a threshold" may, depending on the context, refer to a value being greater than the threshold, greater than or equal to the threshold, less than the threshold, less than or equal to the threshold, equal to the threshold, or not equal to the threshold, among other examples.

As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (for example, a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," and similar terms are intended to be open-ended terms that do not limit an element that they modify (for example, an element "having" A may also have B). Further, the phrase "based on" is intended to mean "based on or otherwise in association with" unless explicitly stated otherwise. Also, as used herein, the term "or" is intended to be inclusive when used in a series and may be used interchangeably with "and/or," unless explicitly stated otherwise (for example, if used in combination with "either" or "only one of"). It should be understood that "one or more" is equivalent to "at least one."

Even though particular combinations of features are recited in the claims or disclosed in the specification, these combinations are not intended to limit the disclosure of various aspects. Many of these features may be combined in ways not specifically recited in the claims or disclosed in the specification. The disclosure of various aspects includes each dependent claim in combination with every other claim in the claim set.

What is claimed is:

1. A transmitter for wireless communication, comprising:

a processing system that includes one or more processors and one or more memories coupled with the one or more processors, the processing system configured to cause the transmitter to:

obtain an input sequence including a set of information bits and a set of frozen bits, the set of information bits associated with a set of information bit locations that satisfies a systematic encoding condition in accordance with a rate matching mode;

encode the input sequence using a systematic polar encoder to obtain a systematic polar code that includes a first sequence of coded bits, wherein the processing system, to encode the input sequence using the systematic polar encoder, is configured to:

reset a set of bits in a non-systematic polar code at positions corresponding to the set of frozen bits to a value associated with the set of frozen bits;

perform a rate matching operation on the first sequence of coded bits in accordance with the rate matching mode to produce a second sequence of coded bits associated with the systematic polar code; and transmit a signal comprising the second sequence of coded bits associated with the systematic polar code in accordance with the rate matching mode.

2. The transmitter of claim 1, wherein the rate matching mode is a puncturing mode in which the second sequence of coded bits are associated with indexes from N−M to N−1, such that bits associated with indexes from 0 to N−M−1 are untransmitted, where N is a length of the first sequence of coded bits and M is an integer having a smaller value than N.

3. The transmitter of claim 2, wherein the systematic polar code includes a set of punctured locations that satisfies the systematic encoding condition in accordance with the rate matching mode being the puncturing mode.

4. The transmitter of claim 3, wherein the set of punctured locations is associated with a set of punctured indexes that includes, for each respective element a in the set of punctured indexes, every element of an M-dimensional binary field that is smaller than a with respect to a partial order of elements in the M-dimensional binary field, wherein M is a positive integer.

5. The transmitter of claim 1, wherein the rate matching mode is a shortening mode in which the second sequence of coded bits are associated with indexes from 0 to M−1, such that bits associated with indexes from M to N−1 are untransmitted, where N is a length of the first sequence of coded bits and M is an integer having a smaller value than N.

6. The transmitter of claim 5, wherein the systematic polar code includes a set of shortened locations that satisfies the systematic encoding condition in accordance with the rate matching mode being the shortening mode.

7. The transmitter of claim 6, wherein the set of shortened locations is associated with a set of shortened indexes that includes, for each respective element $\alpha$ in the set of shortened indexes, every element of an M-dimensional binary field that is larger than $\alpha$ with respect to a partial order of elements in the M-dimensional binary field, wherein M is a positive integer.

8. The transmitter of claim 1, wherein the set of frozen bits is associated with a set of bit freezing locations that satisfies the systematic encoding condition.

9. The transmitter of claim 8, wherein the set of bit freezing locations is associated with a set of freezing indexes that includes, for each respective element $\alpha$ in the set of freezing indexes, every element of an M-dimensional binary field that is smaller than a with respect to a partial order of elements in the M-dimensional binary field, wherein M is a positive integer.

10. The transmitter of claim 1, wherein the rate matching mode is a repetition mode in which the second sequence of coded bits includes the first sequence of coded bits and a repetition of L coded bits in the first sequence of coded bits, where N is a length of the first sequence of coded bits and L is an integer having a smaller value than N.

11. The transmitter of claim 10, wherein the first sequence of coded bits associated with the systematic polar code includes K systematic bits and N−K non-systematic bits, and wherein the repetition mode prioritizes repetition of the K systematic bits over the N−K non-systematic bits.

12. The transmitter of claim 11, wherein the L coded bits include an initial L systematic bits associated with lowest indexes in accordance with K being greater than L.

13. The transmitter of claim 11, wherein the L coded bits include the K systematic bits and L−K non-systematic bits in accordance with L being greater than K.

14. The transmitter of claim 1, wherein the first sequence of coded bits has a length N and the second sequence of coded bits has a length E, where N and E are integers that have different values.

15. The transmitter of claim 1, wherein the processing system, to encode the input sequence using the systematic polar encoder, is configured to:

perform a first non-systematic encoding on the input sequence to obtain the non-systematic polar code; and perform a second non-systematic encoding on the set of bits in the non-systematic polar code to obtain the systematic polar code.

16. A method for wireless communication by a transmitter, comprising:

obtaining an input sequence including a set of information bits and a set of frozen bits, the set of information bits associated with a set of information bit locations that satisfies a systematic encoding condition in accordance with a rate matching mode;

encoding the input sequence using a systematic polar encoder to obtain a systematic polar code that includes a first sequence of coded bits, wherein the encoding comprises resetting a set of bits in a non-systematic polar code at positions corresponding to the set of frozen bits to a value associated with the set of frozen bits;

performing a rate matching operation on the first sequence of coded bits in accordance with the rate matching mode to produce a second sequence of coded bits associated with the systematic polar code; and transmitting a signal comprising the second sequence of coded bits associated with the systematic polar code in accordance with the rate matching mode.

17. The method of claim 16, wherein the rate matching mode is a puncturing mode in which the second sequence of coded bits are associated with indexes from N−M to N−1, such that bits associated with indexes from 0 to N−M−1 are untransmitted, where N is a length of the first sequence of coded bits and M is an integer having a smaller value than N.

18. The method of claim 17, wherein the systematic polar code includes a set of punctured locations that satisfies the systematic encoding condition in accordance with the rate matching mode being the puncturing mode.

19. The method of claim 18, wherein the set of punctured locations is associated with a set of punctured indexes that includes, for each respective element $\alpha$ in the set of punctured indexes, every element of an M-dimensional binary field that is smaller than $\alpha$ with respect to a partial order of elements in the M-dimensional binary field, wherein M is a positive integer.

20. The method of claim 16, wherein the rate matching mode is a shortening mode in which the second sequence of coded bits are associated with indexes from 0 to M−1, such that bits associated with indexes from M to N−1 are untransmitted, where N is a length of the first sequence of coded bits and M is an integer having a smaller value than N.

21. The method of claim 20, wherein the systematic polar code includes a set of shortened locations that satisfies the systematic encoding condition in accordance with the rate matching mode being the shortening mode.

22. The method of claim 21, wherein the set of shortened locations is associated with a set of shortened indexes that includes, for each respective element α in the set of shortened indexes, every element of an M-dimensional binary field that is larger than α with respect to a partial order of elements in the M-dimensional binary field, wherein M is a positive integer.

23. The method of claim 16, wherein the set of frozen bits is associated with a set of bit freezing locations that satisfies the systematic encoding condition.

24. The method of claim 23, wherein the set of bit freezing locations is associated with a set of freezing indexes that includes, for each respective element α in the set of freezing indexes, every element of an M-dimensional binary field that is smaller than α with respect to a partial order of elements in the M-dimensional binary field, wherein M is a positive integer.

25. The method of claim 16, wherein the rate matching mode is a repetition mode in which the second sequence of coded bits includes the first sequence of coded bits and a repetition of L coded bits in the first sequence of coded bits, where N is a length of the first sequence of coded bits and L is an integer having a smaller value than N.

26. The method of claim 25, wherein the first sequence of coded bits associated with the systematic polar code includes K systematic bits and N−K non-systematic bits, and wherein the repetition mode prioritizes repetition of the K systematic bits over the N−K non-systematic bits.

27. The method of claim 26, wherein the L coded bits include an initial L systematic bits associated with lowest indexes in accordance with K being greater than L.

28. The method of claim 26, wherein the L coded bits include the K systematic bits and L−K non-systematic bits in accordance with L being greater than K.

29. The method of claim 16, wherein the first sequence of coded bits has a length N and the second sequence of coded bits has a length E, where N and E are integers that have different values.

30. The method of claim 16, wherein the encoding comprises:
- performing a first non-systematic encoding on the input sequence to obtain the non-systematic polar code; and
- performing a second non-systematic encoding on the set of bits in the non-systematic polar code to obtain the systematic polar code.

31. A non-transitory computer-readable medium storing a set of instructions for wireless communication, the set of instructions comprising:
- one or more instructions that, when executed by one or more processors of a transmitter, cause the transmitter to:
  - obtain an input sequence including a set of information bits and a set of frozen bits, the set of information bits associated with a set of information bit locations that satisfies a systematic encoding condition in accordance with a rate matching mode;
  - encode the input sequence using a systematic polar encoder to obtain a systematic polar code that includes a first sequence of coded bits, wherein to cause the transmitter to encode the input sequence using the systematic polar encoder, the set of instructions cause the transmitter to:
    - reset a set of bits in a non-systematic polar code at positions corresponding to the set of frozen bits to a value associated with the set of frozen bits;
  - perform a rate matching operation on the first sequence of coded bits in accordance with the rate matching mode to produce a second sequence of coded bits associated with the systematic polar code; and
  - transmit a signal comprising the second sequence of coded bits associated with the systematic polar code in accordance with the rate matching mode.

32. A system configured to:
- obtain an input sequence including a set of information bits and a set of frozen bits, the set of information bits associated with a set of information bit locations that satisfies a systematic encoding condition in accordance with a rate matching mode;
- encode the input sequence using a systematic polar encoder to obtain a systematic polar code that includes a first sequence of coded bits, wherein the system, to encode the input sequence using the systematic polar encoder, is configured to:
  - reset a set of bits in a non-systematic polar code at positions corresponding to the set of frozen bits to a value associated with the set of frozen bits;
- perform a rate matching operation on the first sequence of coded bits in accordance with the rate matching mode to produce a second sequence of coded bits associated with the systematic polar code; and
- transmit a signal comprising the second sequence of coded bits associated with the systematic polar code in accordance with the rate matching mode.

* * * * *